(12) United States Patent
Jeong et al.

(10) Patent No.: US 12,484,335 B2
(45) Date of Patent: Nov. 25, 2025

(54) DESIGNABLE SHINGLED PHOTOVOLTAIC MODULE AND MANUFACTURING METHOD THEREFOR

(71) Applicant: KOREA INSTITUTE OF INDUSTRIAL TECHNOLOGY, Cheonan-si (KR)

(72) Inventors: Chae Hwan Jeong, Gwangju (KR); Min Joon Park, Gwangju (KR); Hong Sub Jee, Gwangju (KR); Jin Ho Song, Gwangju (KR)

(73) Assignee: KOREA INSTITUTE OF INDUSTRIAL TECHNOLOGY, Cheonan-si (KR)

( * ) Notice: Subject to any disclaimer, the term of this patent is extended or adjusted under 35 U.S.C. 154(b) by 0 days.

(21) Appl. No.: 17/907,526

(22) PCT Filed: Jul. 15, 2020

(86) PCT No.: PCT/KR2020/009313
§ 371 (c)(1),
(2) Date: Sep. 27, 2022

(87) PCT Pub. No.: WO2021/201342
PCT Pub. Date: Oct. 7, 2021

(65) Prior Publication Data
US 2023/0144536 A1 May 11, 2023

(30) Foreign Application Priority Data

Mar. 31, 2020 (KR) .................. 10-2020-0038846
Jun. 2, 2020 (KR) .................. 10-2020-0066337

(51) Int. Cl.
*H10F 77/20* (2025.01)
*H10F 19/90* (2025.01)
(Continued)

(52) U.S. Cl.
CPC ......... *H10F 77/215* (2025.01); *H10F 19/904* (2025.01); *H10F 77/211* (2025.01); *H10F 77/937* (2025.01); *H10F 71/128* (2025.01)

(58) Field of Classification Search
CPC ......... H01L 31/0201; H01L 31/022433; H01L 31/05–0516; H10F 19/904; H10F 77/211; H10F 77/215; H10F 77/937
See application file for complete search history.

(56) References Cited

U.S. PATENT DOCUMENTS

| | | | | |
|---|---|---|---|---|
| 4,590,327 A | * | 5/1986 | Nath | H01L 31/076 136/258 |
| 4,617,421 A | * | 10/1986 | Nath | H01L 31/0445 136/258 |
| 2014/0124013 A1 | * | 5/2014 | Morad | H02S 40/36 136/246 |

FOREIGN PATENT DOCUMENTS

| | | | |
|---|---|---|---|
| CN | 108258075 A | * | 7/2018 |
| CN | 209119119 U | * | 7/2019 |
| KR | 10-2018-0072110 | * | 6/2018 |

OTHER PUBLICATIONS

English machine translation of KR 10-2018-0072110. (Year: 2018).*
English machine translation of CN 108258075A. (Year: 2018).*
CN 209119119U English machine translation. (Year: 2019).*

* cited by examiner

Primary Examiner — Lindsey A Buck

(57) ABSTRACT

The disclosed invention provides a photovoltaic module with an improved electrode structure of a solar cell and having any of various shapes. The photovoltaic module includes electrode members each including a finger electrode and a busbar electrode on a front surface of a solar cell to correspond to the number of divided cells, wherein the finger electrode is disposed as a plurality of finger electrodes in a first direction parallel to a short side of a divided unit (Continued)

cell, and the busbar electrode includes a collection electrode line which extends in a second direction parallel to a long side of the divided unit cell and connects ends of the plurality of finger electrodes and a connecting electrode line which is branched off from an end of the collection electrode line and extends in the first direction to be electrically connected to another unit cell.

5 Claims, 21 Drawing Sheets

(51) Int. Cl.
*H10F 77/00* (2025.01)
*H10F 71/00* (2025.01)

DESIGNABLE SHINGLED PHOTOVOLTAIC MODULE AND MANUFACTURING METHOD THEREFOR

TECHNICAL FIELD

The present invention relates to a designable shingled photovoltaic module in which an electrode structure is improved for variously designing the photovoltaic module and which is manufactured by connecting strings connected in a shingled manner using a flexible connecting wire, and a method of manufacturing the photovoltaic module.

BACKGROUND ART

Solar power generation involves generating power by converting light energy of the sun to electrical energy which is sustainable eco-friendly energy with low carbon and will not run out in the future unlike fossil fuels.

In conventional photovoltaic module manufacturing, cells are connected using metal ribbons, and thus spaces for electrically separating the cells are required when strings are manufactured. Accordingly, spaces in which a current is not generated are formed in the module, and thus output loss occurs. In addition, since the cells include front busbars, a current cannot be generated in these portions, and thus output loss is induced.

In another method, a photovoltaic module having a shingled array structure may be manufactured through an electrically conductive adhesive (ECA). For example, in a method of applying the ECA on front busbars of divided cells to connect the busbars to electrode pads (Ag) of other divided cells, since a busbarless structure in which a busbar is not present on a front surface is formed, there is an advantage that optical loss due to the busbar can be reduced, and since spaces for separating cells are not required unlike a conventional module, a larger number of cells can be occupied in the same area than the conventional module, and relatively high power can be output. For example, in patent document 1, as illustrated in FIGS. 1 and 2, a busbar electrode 61 of a lower divided cell 7 is disposed to overlap a busbar electrode 62 of a rear surface of an upper divided cell 7 and is electrically connected to the busbar electrode 62 using a conductive member 9.

In Japanese Patent No. 10-6467549, a string is manufactured by forming busbar electrodes in straight lines adjacent to long sides of divided cells divided into rectangular shapes and arranging the long sides of the upper cells to overlap the long sides of the lower cells when the divided cells are connected.

According to the conventional technology, although a length of a string can be adjusted by connecting the larger number of divided cells to correspond to a size of a photovoltaic module, since a width of the string is limited due to a long side of the divided cell, there is a problem of difficulty in various designing a shape of a photovoltaic module formed by variously combining strings.

The use of photovoltaic power generation facilities capable of generating electric power using solar energy is becoming more common. Since solar cells using solar energy do not use fossil fuels such as coal or petroleum but use sunlight which is a pollution-free and infinite energy source, the solar cells are spotlighted as new alternative energy sources in the future and are currently used to obtain power generated by solar power plants, buildings, vehicles, and the like.

Among various application fields of solar cells, a field of building integrated photovoltaic (BIPV) is a solar cell field of which rapid market growth is expected in the future, and particularly, a field of a window-type solar cells may be a next generation solar cell field in which not only a high power generation efficiency but also a high light transmittance are required. A dye-sensitized solar cell (DSSC) may be suitable for BIPV for a window because it allows light transmittance of a power generator to be controlled by adjusting dispersibility, and a film thickness of N-type semiconductor nanoparticles and a color or image thereof to be controlled. However, since a stability issue which is a most basic requirement for a solar cell is not solved yet, it is expected to take a long time for actual application. In addition, since a liquid electrolyte which is very toxic to the human body is used in the DSSC, a serious stability problem due to leakage of toxic substances may occur in case of damage.

According to the conventional technology, although a length of a string may be adjusted by connecting a larger number of divided cells to correspond to a size of a photovoltaic module, since a width of the string is limited due to a long side of the divided cell, there is a problem of a difficulty in variously designing a shape of a photovoltaic module formed by variously combining strings.

Accordingly, a BIPV solar cell for a window which secures light receiving performance and has superior stability using translucent high-efficiency silicon solar cells needs to be manufactured. In addition, a new solar cell structure capable of being applied to a window of a building and a vehicle to be rollable and receiving light through two surfaces and a manufacturing process therefor are required.

[Document 1] Japanese Patent No. 10-6467549 (registered on Jan. 18, 2019)

[Document 2] Korean Patent Publication No. 10-2019-0031995 (published on Mar. 27, 2019)

Technical Problem

The present invention is directed to providing a photovoltaic module having various types by improving an electrode structure of a solar cell to adjust a width and a length of a string in which unit cells are connected in a shingled manner.

Technical Solution

One aspect of the present invention provides a designable shingled photovoltaic module including electrode members each including a finger electrode and a busbar electrode on a front surface of a solar cell to correspond to the number of divided cells, wherein the finger electrode is disposed as a plurality of finger electrodes in a first direction parallel to a short side of a divided unit cell, and the busbar electrode includes a collection electrode line which extends in a second direction parallel to a long side of the divided unit cell and connects ends of the plurality of finger electrodes and a connecting electrode line which is branched off from an end of the collection electrode line and extends in the first direction to be electrically connected to another unit cell.

The connecting electrode line may be disposed adjacent to the short side of the unit cell to be divided, and the collection electrode line may be disposed adjacent to a cut line of the unit cell to be divided.

The connecting electrode line may be perpendicularly bent from the end of the collection electrode line so that the busbar electrode is formed in an "L" or "T" shape, and a length of the connecting electrode line in the "L" shape may be smaller than a length of the connecting electrode line in the "T" shape.

A line width of the busbar electrode may be in the range of 0.8 to 1.2 mm, and a line width of the finger electrode may be in the range of 0.08 to 0.12 mm.

The short side of the unit cell to be divided may be in the range of 13.3 to 66.6 mm.

Another aspect of the present invention provides a method of manufacturing a designable shingled photovoltaic module having a designable shingled string structure, the method including operation (a) of preparing a solar cell having a front surface on which a finger electrode and a busbar electrode are formed and a rear surface on which a rear surface electrode is formed, operation (b) of cutting the solar cell in a rectangular shape through a laser scribing process to divide the solar cell into a plurality of unit cells, and operation (c) of connecting the unit cells to have a shingled array structure in which a short side of any one divided unit cell overlaps a short side of another divided unit cell, wherein, in operation (a), the finger electrode is disposed as a plurality of finger electrodes in a first direction parallel to the short side of the divided unit cell, and the busbar electrode includes a collection electrode line which extends in a second direction parallel to a long side of the divided unit cell and connects ends of the plurality of finger electrodes and a connecting electrode line which is branched off from an end of the collection electrode line and extends in the first direction to be electrically connected to another unit cell to be connected.

In operation (c), a rear surface electrode of any one unit cell and the connecting electrode line of another unit cell may be bonded using an electrically conductive adhesive.

Still another aspect of the present invention provides a method of manufacturing a designable shingled photovoltaic module, the method including (a) forming a solar cell in which a front surface electrode, a finger electrode, and a rear surface electrode are formed on a semiconductor substrate and dividing the solar cell into a plurality of unit cells by cutting the solar cell along cut lines in a checkerboard shape, (b) forming strings by connecting the divided unit cells in a shingled manner, and (c) forming a photovoltaic module by connecting the plurality of strings using a conductive wire embedded in a flexible connecting wire, wherein the forming of the photovoltaic module includes applying an electrically conductive adhesive on electrodes of the unit cells formed at two sides of the strings and electrically connecting the electrodes and the conductive wire through a curing process performed as a thermal process in a state in which the conductive wire is disposed.

In the forming of the photovoltaic module, the number of strings connected by the conductive wire may be in the range of 2 to 200, and a separation distance between the strings may be in the range of 1 to 100 mm.

In the forming of the photovoltaic module, a thermal process temperature in the curing process may be in the range of 130 to 150° C., and a thermal process time may be 10 seconds or less.

In the forming of the photovoltaic module, when the conductive wire having an "E" type electrical connection pattern is applied, three first auxiliary conductive wires branched off from the conductive wire may be directly electrically connected to the electrodes of the unit cells, a diameter of the conductive wire may be 2 to 4 times a diameter of each of the electrodes of the unit cells to be connected, and a diameter of each of the first auxiliary conductive wires may be the same as the diameter of the electrode of the unit cell.

In the forming of the photovoltaic module, when the conductive wire having an "H" type electrical connection pattern is applied, a second auxiliary conductive wire connected to the conductive wire through three first auxiliary conductive wires branched off from the conductive wire and disposed parallel to the conductive wire may be electrically connected to the electrodes of the unit cells, a diameter of the conductive wire may be 2 to 4 times a diameter of the electrode of the unit cell to be connected, and a diameter of each of the first and second auxiliary conductive wires may be the same as the diameter of the electrode of the unit cell.

In the dividing of the unit cells, a horizontal width of each of the unit cells may be in the range of 3 to 50 mm, and a vertical width may be in the range of 3 to 50 mm.

In the forming of the strings, a length of each of the strings formed by connecting the unit cells may be in the range of 50 to 3,000 mm, a width of the string may be in the range of 3 to 25 mm, and an output voltage of the string may be proportional to the number of unit cells connected in series.

The conductive wire may be formed as a composite including a core of which a cross section has a circular shape and a passivation layer plated on the core, the core may be formed of copper (Cu), and the passivation layer may be formed of tin (Sn).

In the forming of the photovoltaic module, the number of strings connected in parallel to reduce shading loss in a string bundle may be set to 5 to 10, and when the photovoltaic module expands according to an installation area, string bundles may be connected in series using the conductive wire.

Yet another aspect of the present invention provides a designable shingled photovoltaic module formed through the method of manufacturing a designable shingled photovoltaic module.

Advantageous Effects

According to the present invention, since both a width and a length of each string used in a shingled array structure can be adjusted by connecting short sides of unit cells divided into a rectangular shape, a photovoltaic module formed by electrically connecting the strings can be implemented in one of various shapes, and thus the photovoltaic module is suitable for a building structure and a vehicle in which atypical installation of photovoltaic modules is required.

According to the present invention, since a busbar electrode can faithfully serve to move carriers collected by a finger electrode by applying a busbar electrode having an "L" shape when a short side of a unit cell with respect to a string width and applying a busbar electrode having a "T" shape when a short side of a unit cell is relatively large when an electrode structure is changed according to a size of a unit cell to be divided according to output characteristics of a solar cell, output power of the photovoltaic module having the shingled array structure can be improved.

According to the present invention, since shading loss can be reduced and the photovoltaic module can also be variously designed by adjusting a length and a width of each string by changing a horizontal width and a vertical width of each unit cell and connecting a plurality of strings formed by bonding the unit cells using a flexible connecting wire in parallel, a window-type photovoltaic module suitable for a building structure and a vehicle can be provided.

According to the present invention, since the photovoltaic module suitable for an installation environment can be manufactured by connecting string bundles in which many strings are bound in series, output power of the photovoltaic module can be easily set to correspond to the installation area.

According to the present invention, when wiring work is performed using a flexible connecting wire, since the string is electrically connected to a conductive wire having an "E" type electrical connection pattern or "H" type electrical connection pattern through a curing process in which a thermal process is simply performed on a conductive adhesive after applying the conductive adhesive on electrodes of the unit cell provided on both sides of the string, cost and working time can be reduced.

MODES OF THE INVENTION

Figure 1:
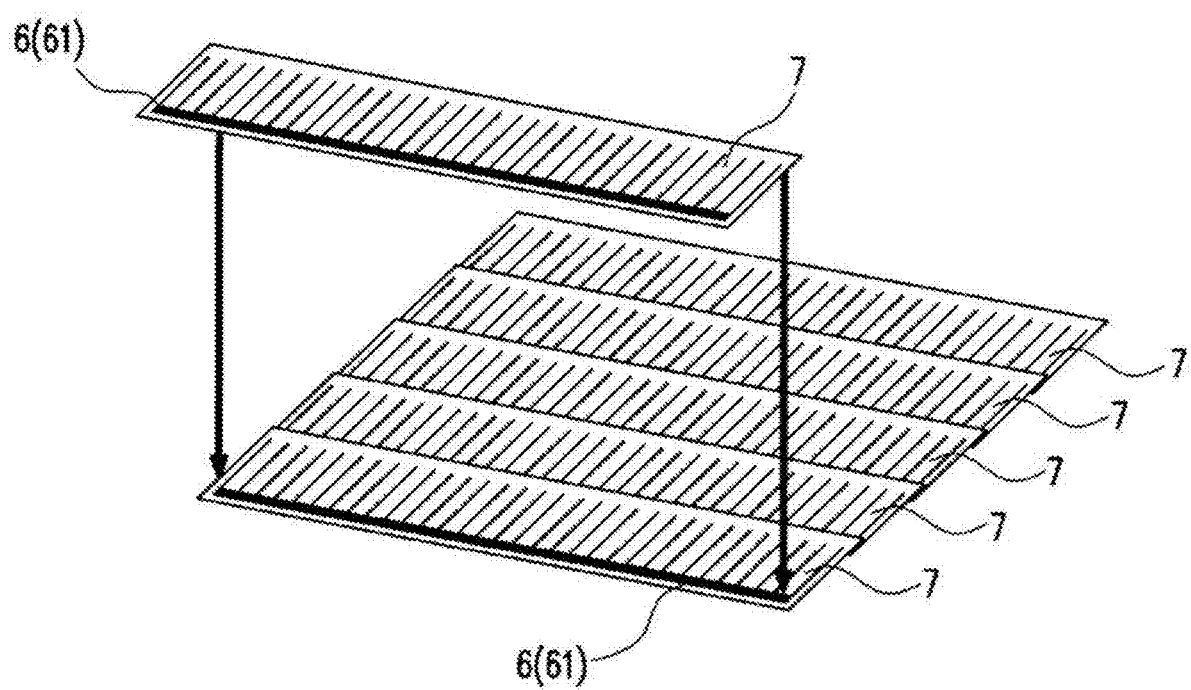
FIGS. 1 and 2 are views showing cell connection according to a conventional technology.
Figure 2:
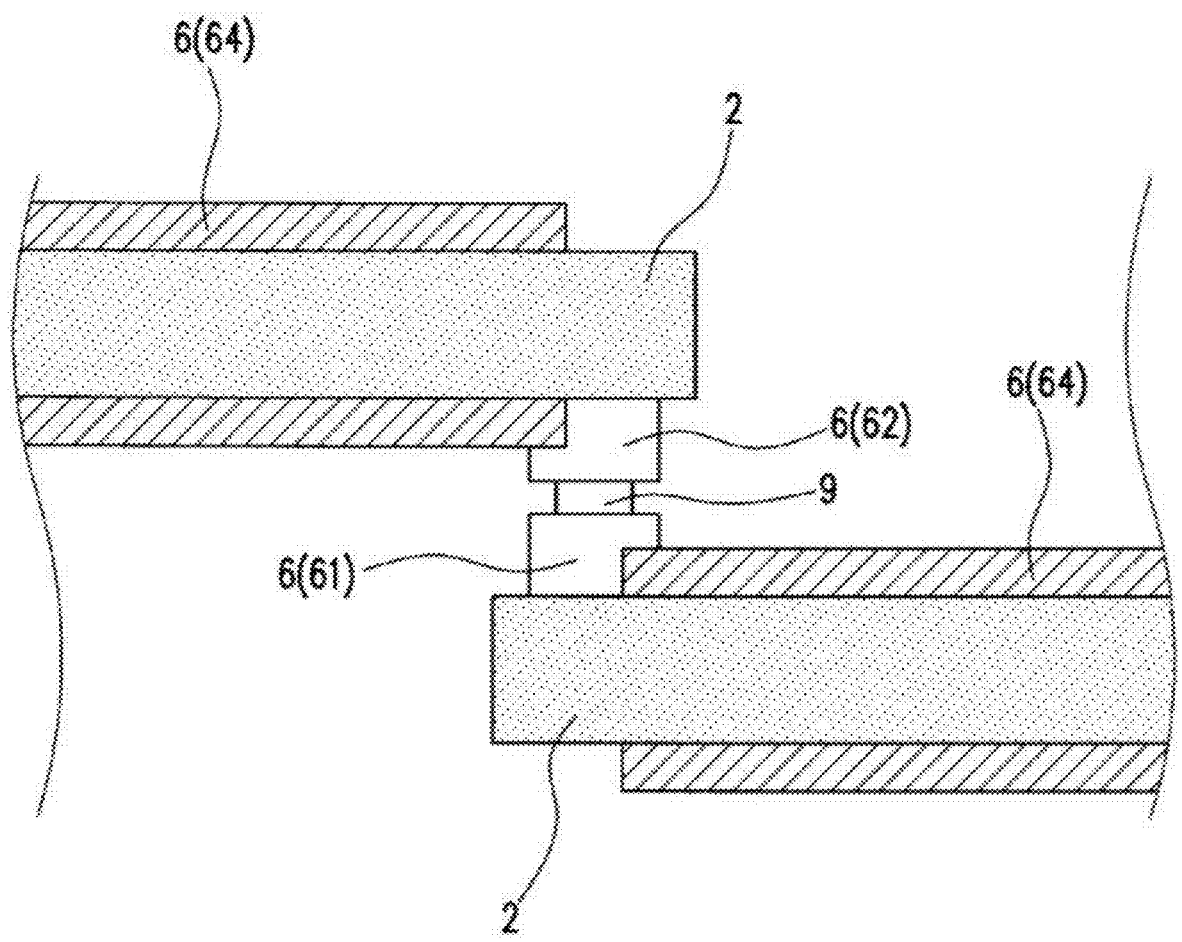

Hereinafter, the present invention will be described by describing embodiments of the present invention with reference to the accompanying drawings. Like reference numerals in the drawings denote like elements. In addition, in the description of the present invention, when it is determined that detailed descriptions of related well-known components and functions unnecessarily obscure the gist of the present invention, the detailed descriptions thereof will be omitted. In addition, when a certain part "includes" a certain component, this does not exclude other components unless explicitly described otherwise, and other components may in fact be included.

The term "shingled array structure" used in the present invention refers to a structure in which a solar cell in which front surface electrodes and rear surface electrodes are provided are cut to form a plurality of unit cells, and the front surface electrodes and the rear surface electrodes are bonded and connected using a conductive adhesive in order to improve a conversion efficiency and output power in units of photovoltaic modules.

In addition, a "photovoltaic module" is a module in which a plurality of solar cell strings having the shingled array structure are electrically connected, glass is positioned on a front surface, and an ethylene-vinyl acetate copolymer (EVA) sheet is formed on a rear surface to form a solar cell panel.

In addition, an "electrically conductive adhesive (ECA)" is an ECA used in wiring circuits or electrical and electronic products, and an epoxy resin mixed with silver particles is used as the ECA. A principle by which the electrically conductive adhesive has an electrically conductive property is that conductive fillers dispersed in an adhesive come in contact with each other to have the electrically conductive property in a curing or solidifying process. In addition, the ECA is applied using a micro dispenser, an amount of the ECA discharged from a needle should be constant, and the ECA should not flow down. A metal powder of gold, platinum, silver, copper, nickel, or the like, carbon fiber, graphite, a composite powder, or the like may be used as the conductive filler.

Figure 3:
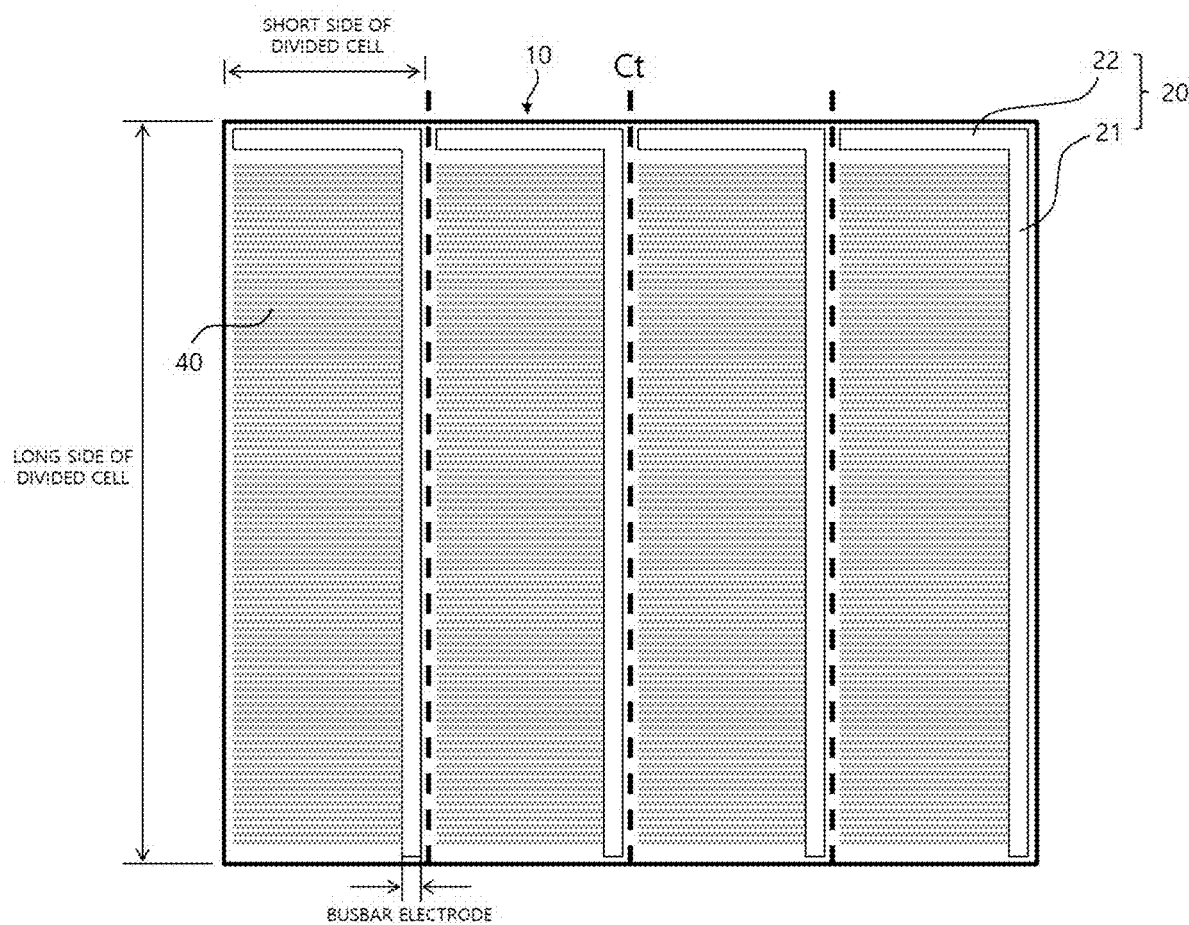
FIG. 3 is a view illustrating a front surface of a solar cell according to an embodiment of the present invention.

A solar cell used in an embodiment of the present invention includes a semiconductor substrate having a substantially rectangular shape and a plurality of finger electrodes and busbar electrodes formed on the semiconductor substrate. In FIG. 3, the solar cell has the semiconductor substrate having a quadrangular shape, and a semiconductor substrate having an octagonal shape formed by chamfering four corners may also be used as the solar cell.

Divided cells used in the present invention may be formed by dividing the semiconductor substrate into a plurality of cells, and may be formed as rectangular unit cells having the same shape according to the number of divided cells. For example, a size of the solar cell is 156.75 mm×156.75 mm.

In consideration of output power of the solar cell, the solar cell may be divided into 3 to 12 unit cells, and a short side of a divided unit cell 10 is in the range of 13.3 to 66.6 mm.

In one embodiment, as illustrated in FIG. 3, the solar cell is divided into four unit cells 10 and may be divided to have the same size along cut lines Ct through a laser scribing process. Electrode members including busbar electrodes 20 and finger electrodes 40 corresponding to the number of divided cells may be formed on a front surface of the solar cell. That is, the divided unit cells 10 may have the same size and the same shape, and the same electrode pattern may be formed on the divided unit cells 10.

The plurality of finger electrodes 40 are disposed in a first direction parallel to a short side of the divided unit cell 10 and serve to collect photoelectrically converted carriers. A line width of each of the finger electrodes 40 is in the range of 0.08 to 0.12 mm.

Each of the busbar electrodes 20 serves to move the carriers collected through the finger electrodes 40 to an external storage battery or the like. The busbar electrodes 20 include collection electrode lines 21 for connecting ends of the plurality of finger electrodes 40 and connecting electrode lines 22 for being electrically connected to different unit cells.

Each of the collection electrode lines 21 extends in a second direction parallel to a long side of the divided unit cell 10, and each of the connecting electrode lines 22 is branched off from an end of the collection electrode line 21 and extends in the first direction.

The collection electrode line 21 and the connecting electrode line 22 may be disposed along an edge of the divided unit cell 10, the collection electrode line 21 is disposed adjacent to the cut line Ct of the unit cell 10 to be divided, and the connecting electrode line 22 is disposed adjacent to the short side of the unit cell 10 to be divided.

The connecting electrode line 22 is perpendicularly bent from an end of the collection electrode line 21, and the entirety of the collection electrode line 21 and the connecting electrode line 22 may be formed in an "L" shape. A line width of the busbar electrode 20 is in the range of 0.8 to 1.2 mm.

Figure 4:
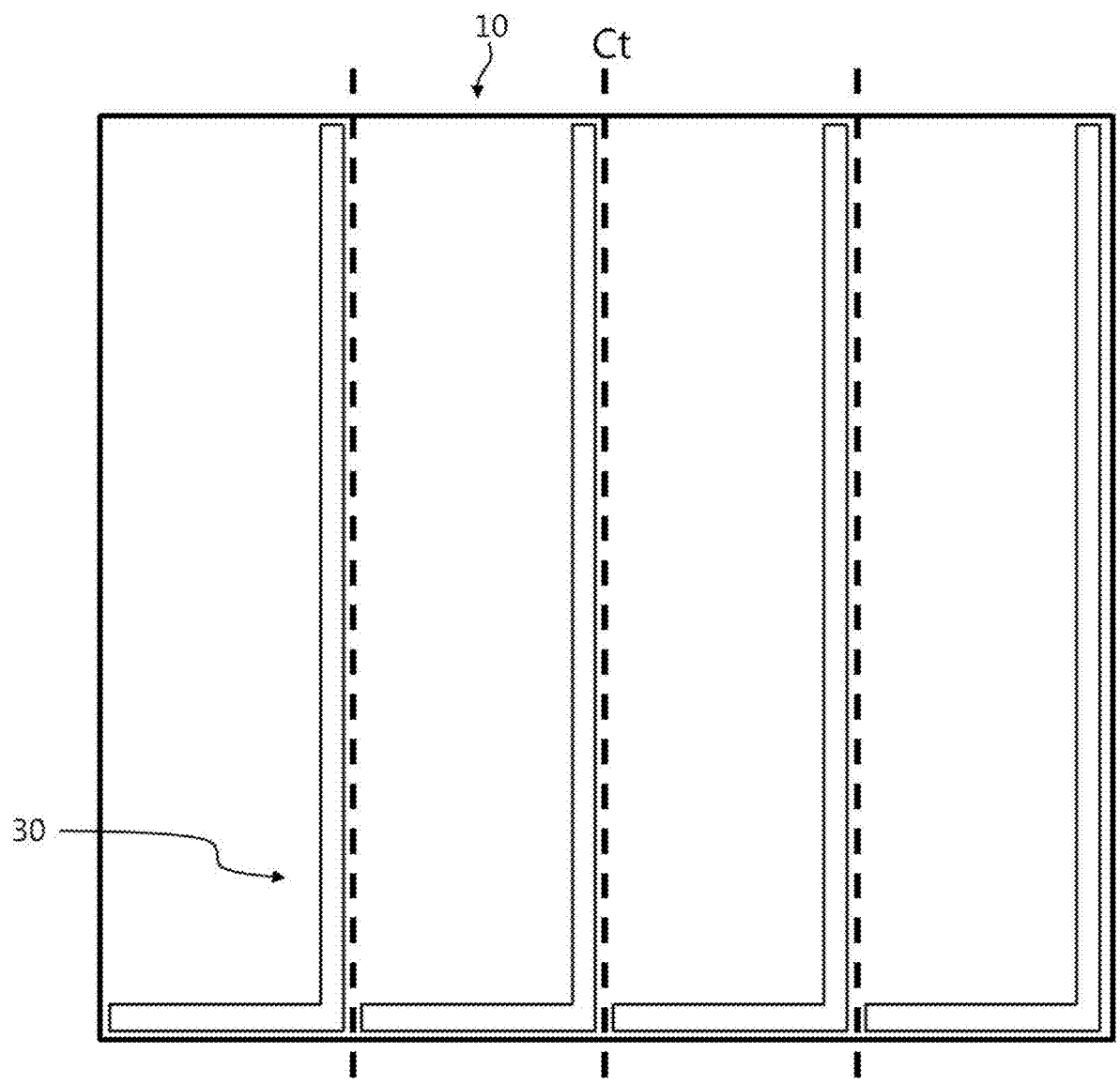
FIG. 4 is a view illustrating a rear surface of the solar cell of FIG. 3.

Referring to FIG. 4, rear surface electrodes 30 may be formed on rear surfaces of the unit cells 10 to be divided to correspond to the number of cells to be divided. Each of the rear surface electrodes 30 may be formed to have the same electrode pattern as the busbar electrode 20 formed on front surfaces. The rear surface electrode 30 is electrically physically connected to the connecting electrode line 22 of another unit cell 10.

Figure 5:
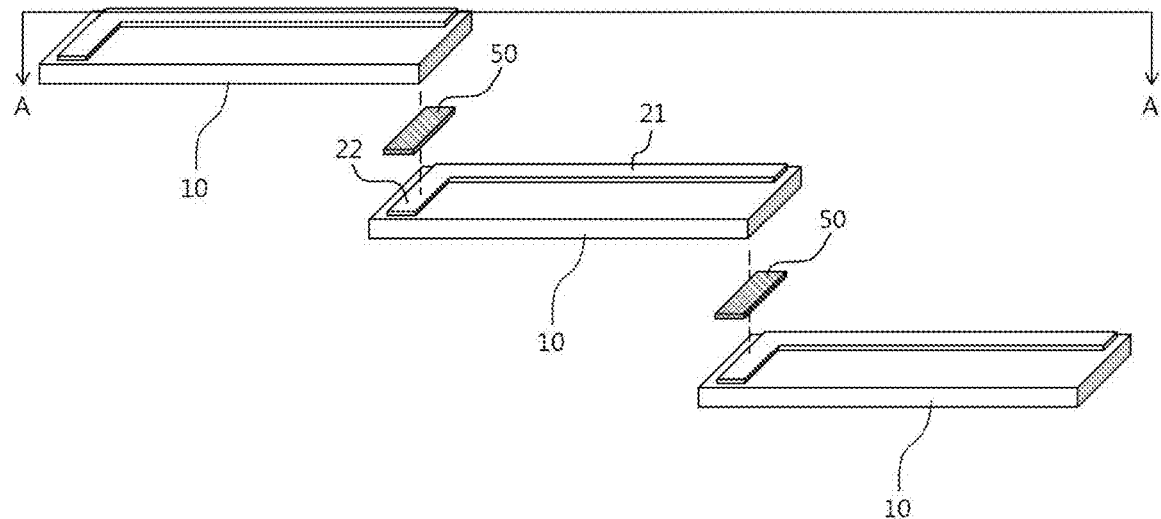
FIG. 5 is a view showing connection of divided unit cells of FIG. 3.
Figure 6:
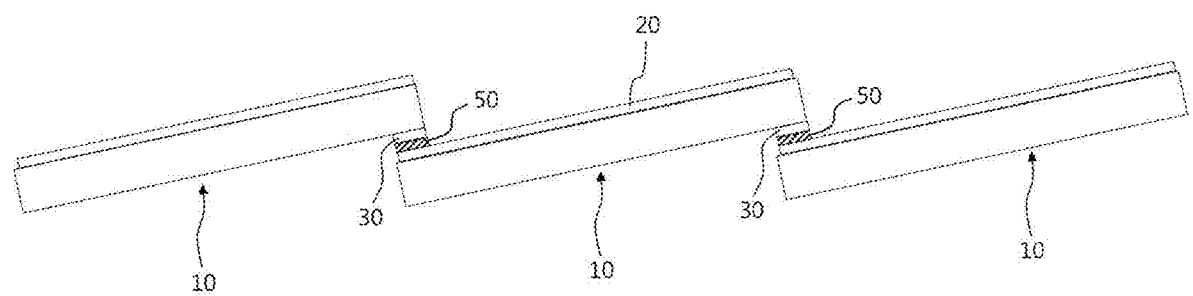
FIG. 6 is a cross-sectional view along line A-A of FIG. 5 showing a state in which the divided unit cells of FIG. 3 are connected.

As illustrated in FIGS. 5 and 6, the divided unit cells 10 may be connected by an ECA 50 through a thermal process in order to form a photovoltaic module having a shingled array structure. For example, a string array structure may be formed by overlapping a short side of any one unit cell 10 and a short side of another unit cell 10, and by arranging the ECA 50 between the rear surface electrode 30 of the upper unit cell 10 and the connecting electrode line 22 of the busbar electrode 20 of the lower unit cell 10 and bonding the rear surface electrode 30 and the connecting electrode line 22 through the thermal process, two unit cells 10 are integrated, and a state in which a current collected through the finger electrodes 40 flows is implemented at the same time.

Unlike the previously described embodiment, when a size of a divided cell needs to be increased relatively, an electrode structure of a busbar electrode 20 may be changed.

Figure 7:
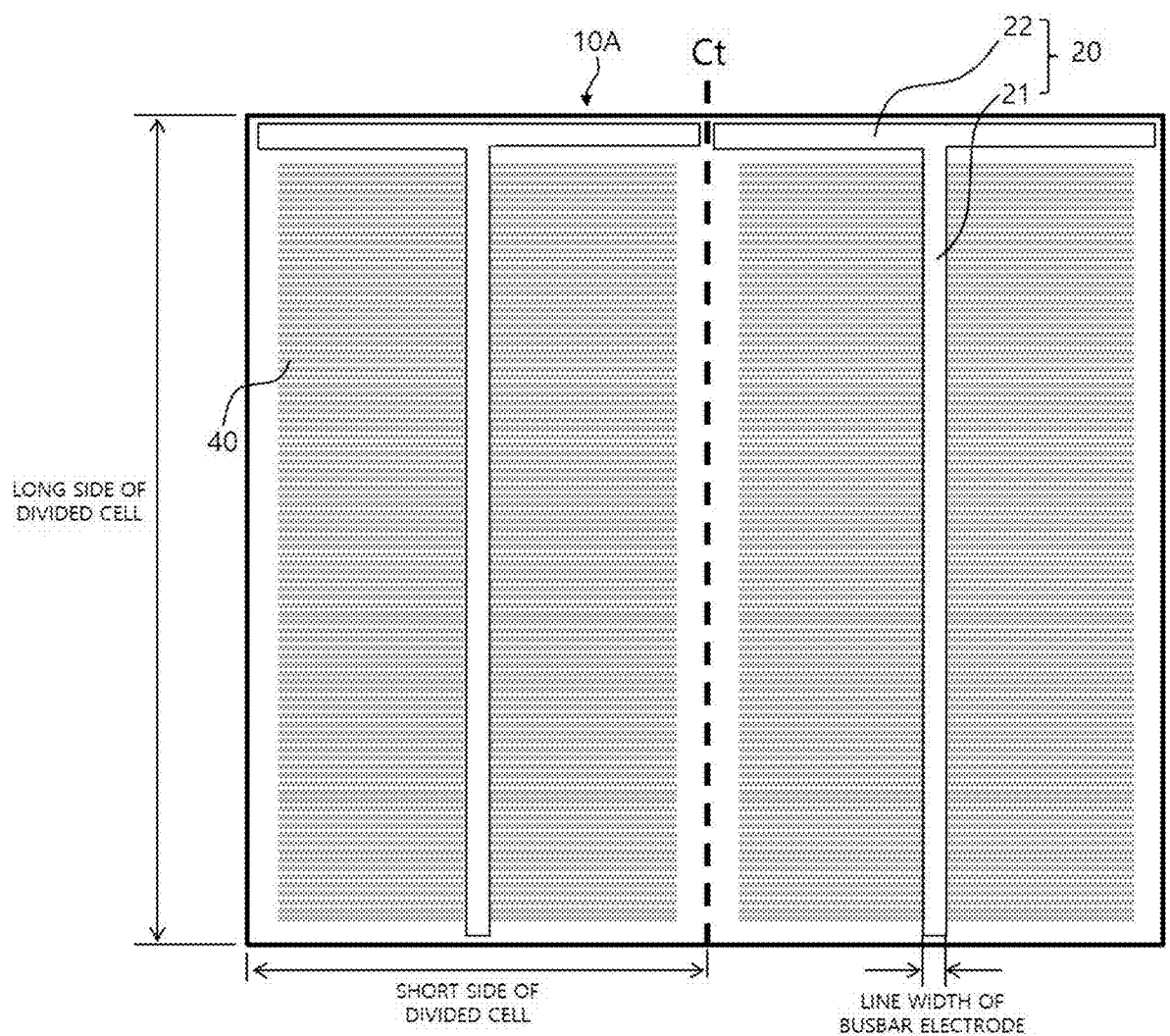
FIG. 7 is a view illustrating a front surface of a solar cell according to another embodiment of the present invention.

As illustrated in FIG. 7, a plurality of divided cells used in an embodiment of the present invention may be formed by dividing a semiconductor substrate, and unit cells are formed in the same rectangular shape according to the number of divided unit cells. For example, a solar cell may be divided into two unit cells. For example, when a solar cell is divided into two unit cells 10A, the two unit cells 10A may be divided to have the same size along a cut line Ct through a laser scribing process. Electrode members including busbar electrodes 20 and finger electrodes 40 corresponding to the divided cells may be formed on a front surface of the solar cell. That is, the divided unit cells 10A may have the same size and the same shape, and the same electrode pattern may be formed on the divided unit cells 10A.

Each of the plurality of finger electrodes 40 is disposed in a first direction parallel to a short side of the divided unit cell 10, and a line width of the finger electrode 40 is in the range of 0.08 to 0.12 mm.

Each of the busbar electrodes 20 serves to move carriers collected by the finger electrodes 40 to an external storage battery or the like. The busbar electrodes 20 include collection electrode lines 21 for connecting ends of the plurality of finger electrodes 40 and connecting electrode lines 22 for being electrically connected the other unit cells.

Each of the collection electrode lines 21 extends in a second direction parallel to a long side of the divided unit cell 1, and each of the connecting electrode lines 22 is branched from an end of the collection electrode line 21 toward two sides and extends in the first direction.

The collection electrode line 21 and the connecting electrode line 22 may be disposed along an edge of the divided unit cell 10, the collection electrode line 21 is disposed parallel to the cut line Ct of the unit cell 10 to be divided, and the connecting electrode line 22 is disposed adjacent to a short side of the unit cell 10.

The connecting electrode line 22 is bent from the end of the collection electrode line 21 in both directions, and the entirety of the collection electrode line 21 and the connecting electrode line 22 may be formed in a "T" shape. A line width of the busbar electrode 20 is in the range of 0.8 to 1.2 mm.

Figure 8:
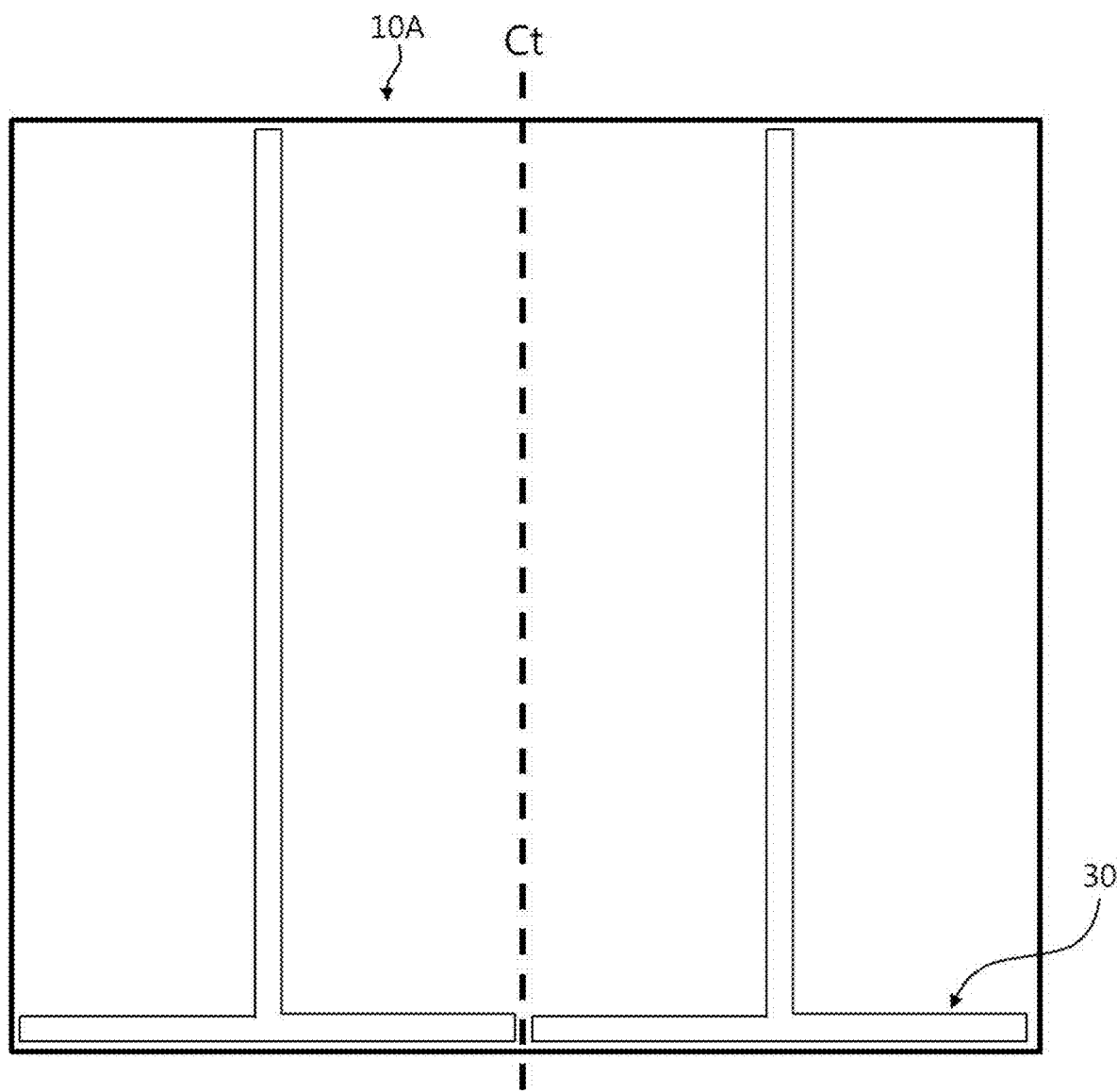
FIG. 8 is a view illustrating a rear surface of the solar cell of FIG. 7.

Referring to FIG. 8, rear surface electrodes 30 corresponding to the number of the unit cells to be divided may be formed on rear surfaces of the unit cells 10A to be divided. Each of the rear surface electrodes 30 may be formed to be the same as an electrode pattern of the busbar electrode 20 formed on front surfaces. The rear surface electrode 30 is electrically and physically connected to the connecting electrode line 22 of another unit cell 10A.

Figure 9:
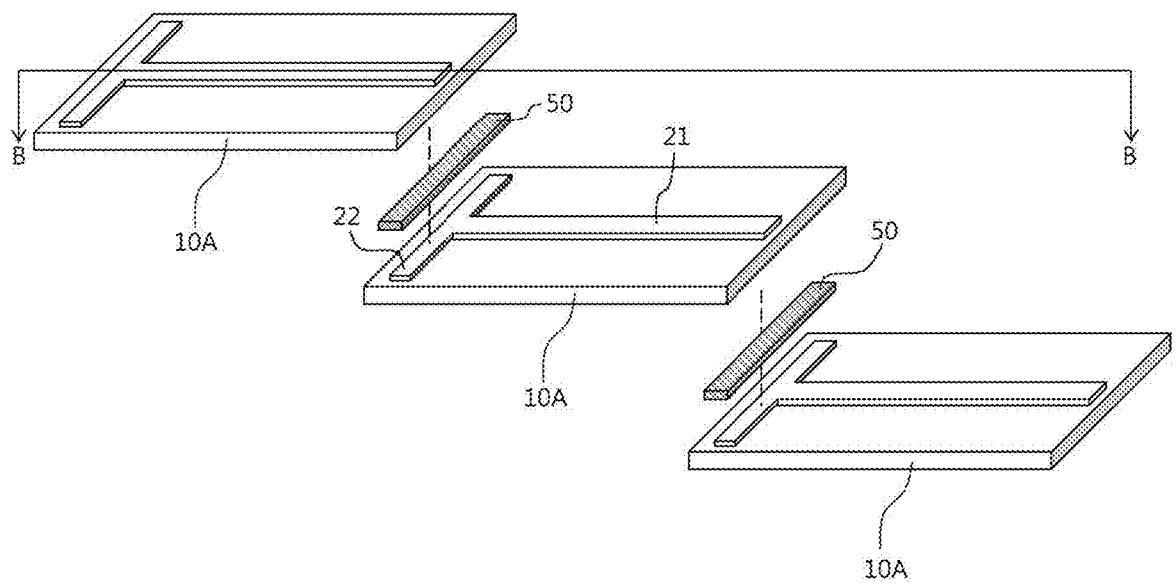
FIG. 9 is a view showing connection of divided unit cells of FIG. 7.
Figure 10:
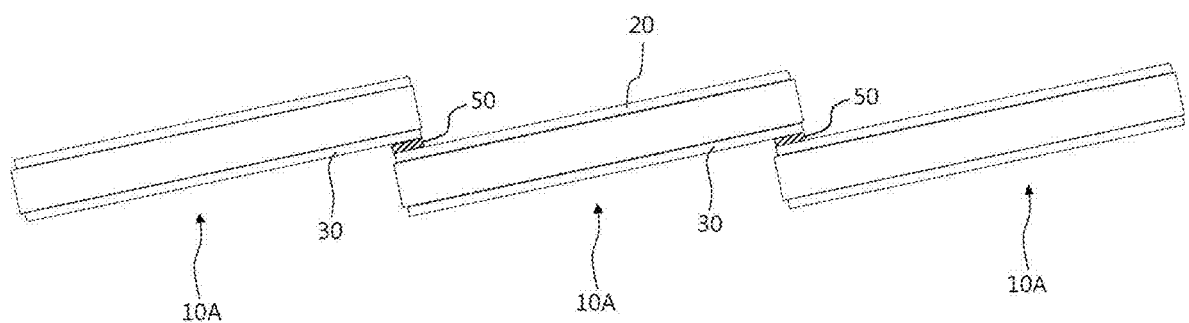
FIG. 10 is a cross-sectional view along line B-B of FIG. 9 showing a state in which the divided unit cells of FIG. 7 are connected.

As illustrated in FIGS. 9 and 10, the divided unit cells 10A may be connected by an ECA 50 through a thermal process in order to form a photovoltaic module having a shingled array structure. For example, a string array structure may be formed by overlapping a short side of any one unit cell 10A and a short side of another unit cell 10A, and by arranging the ECA 50 between the rear surface electrode 30 of the upper unit cell 10A and the connecting electrode line 22 of the busbar electrode 20 of the lower unit cell 10A and bonding the rear surface electrode 30 and the connecting electrode line 22 through the thermal process, two unit cells 10A are integrated, and a state in which a current collected through the finger electrodes 40 flows is implemented at the same time.

Figure 11:
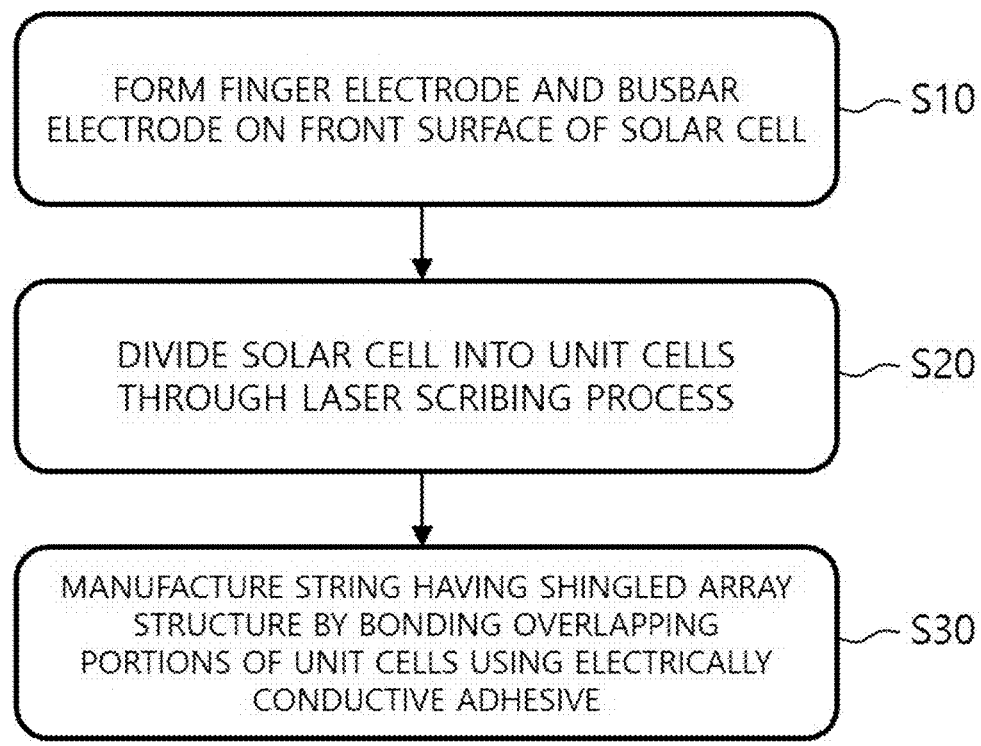
FIG. 11 is a flowchart for manufacturing a photovoltaic module according to an embodiment of the present invention.

A method of manufacturing the photovoltaic module according to an embodiment will be described with reference to FIG. 11.

First, a solar cell in which finger electrodes 40 and busbar electrodes 20 are formed on a front surface and rear surface electrodes 30 are formed on a rear surface is prepared (S10). In this case, the plurality of finger electrodes 40 are disposed in a first direction parallel to short sides of divided unit cells, and the busbar electrodes 20 include collection electrode lines 21 which extend in a second direction parallel to long sides of the divided unit cells and are connected to ends of the plurality of finger electrodes and connecting electrode lines 22 which are branched off from ends of the collection electrode lines 21 in the first direction to be electrically connected to other unit cells to be connected.

For example, the solar cell may include a semiconductor substrate, emitters formed on a front surface which is an incidence surface of the semiconductor substrate on which light is incident, an anti-reflection film formed on the emitters, a plurality of passivation layers formed on a rear surface opposite to the front surface of the semiconductor substrate, electrode members including the plurality of busbar electrodes 20 and finger electrodes 40 electrically connected to the emitters, the rear surface electrodes 30 formed between the plurality of passivation layers and the semiconductor substrate, and a plurality of rear surface electric field layers formed between the rear surface electrodes 30 and the semiconductor substrate.

The semiconductor substrate may be a semiconductor including a first conductive type, for example, a conductive n-type or p-type, silicon, and each of the emitters includes second conductive type, for example, conductive p-type or n-type, impurities of which the conductive type is opposite to that of the semiconductor substrate and forms a p-n junction with the semiconductor substrate.

The anti-reflection film may be formed by depositing a silicon nitride film ($SiN_x$) or silicon oxide film ($SiO_x$) on the emitters, and the plurality of passivation layers are formed on the rear surface of the semiconductor substrate and serve to reduce a recombination rate of charges near the rear surface of the semiconductor substrate.

The plurality of busbar electrodes 20 and finger electrodes 40 are formed on and electrically connected to the emitters and disposed apart from each other in a predetermined direction. The finger electrodes 40 serve to collect carriers, for example, holes/electrons, moved to the emitters, and the busbar electrodes 20 serve to output the carriers to an external apparatus (load). Each of the plurality of busbar electrodes 20 and finger electrodes 40 includes at least one selected from the group consisting of Ni, Cu, Ag, Al, Sn, Zn, In, Ti, Au, and a combination thereof. In the present invention, each of the busbar electrode 20 and the finger electrode 40 includes Ag.

Each of the rear surface electrodes 30 may include a conductive material and may be integrally formed with the plurality of passivation layers on the rear surface of the semiconductor substrate. The rear surface electrode 30 includes at least one selected from Ni, Cu, Ag, Al, Sn, Zn, In, Ti, Au, and a combination thereof. In the present invention, the rear surface electrode 30 includes Al in consideration of manufacturing costs and the like.

The rear surface electric field layer may be formed between the rear surface electrode 30 and the semiconductor substrate and serves to prevent a phenomenon in which the movement of the holes/electrons toward the rear surface of the substrate is hindered and electrons and holes are recombined to disappear on the rear surface of the semiconductor substrate.

Then, the solar cell prepared in operation S10 is divided into a plurality of unit cells 10 or 10A by cutting the solar cell in a rectangular shape (S20).

The cutting in operation S20 may be performed by, for example, a nanosecond laser (532 nm, 20 ns, 30 to 100 KHz from coherent). That is, the cutting in operation S20 may be performed by the 20 ns laser which uses a wavelength of 532 nm and in which an average power is set to 10 W, a frequency is set to 50 KHz, and a scan speed is set to 1,300 mm/s.

Subsequently, an ECA 50 is applied on any one side among a short side of any one upper unit cell 10 or 10A prepared in operation S20 and a short side of another lower unit cell 10 or 10A to bond any one upper unit cell 10 or 10A and another lower unit cell 10 or 10A in a shingled array structure (S30).

Among ECAs on the market, a product that has a high conductivity and a suitable viscosity and is suitable for the present invention, for example, EL-3012, EL-3556, EL-3653, or EL-3655 of SKC Panacol or CE3103WLV or CA3556HF of Henkel, may be applied to the ECA 50. For example, an adhesive having properties of a viscosity of 28,000 to 35,000 mPa·s(cP) at 25° C., a volume resistivity of 0.0025 Ω·cm as an electrical characteristic, a curing temperature of 130 to 150° C., and a curing time of 25 to 35 seconds is applied to the ECA 50. In addition, a conductive filler in the ECA may include at least one material selected from the group consisting of Au, Pt, Pd, Ag, Cu, Ni, and carbon.

In operation S30, the application of the ECA is performed by controlling a discharge amount of the ECA discharged from a needle of a micro dispenser. The application of the ECA is performed using an ECA, which has properties of, for example, a viscosity of 28,000 to 35,000 mPa·s(cP) at a temperature of 25° C., a volume resistivity of 0.0025 Ω·cm as an electrical characteristic, a curing temperature of 130 to 150° C., and a curing time of 25 to 35 seconds, and by controlling revolutions per minute (RPM) to control a discharge amount of the needle of the micro dispenser, wherein the needle has a diameter of 250 μm.

The application of the ECA may be performed on any one side among the rear surface electrode 30 at the short side of the any one upper unit cell 10 or 10A and the connecting electrode line 22 of the busbar electrode 20 at the short side of the other lower unit cell 10 or 10A or on both sides among the rear surface electrode 30 and the connecting electrode line 22. A position of the application may be determined according to properties and a discharge amount of the ECA.

The ECA is applied, and bonding is performed to implement the shingled array structure to form a solar cell string. In this case, the forming of the string may be performed under thermal process conditions of a time of 25 to 35 seconds and a temperature of 130 to 150° C.

Figure 12:
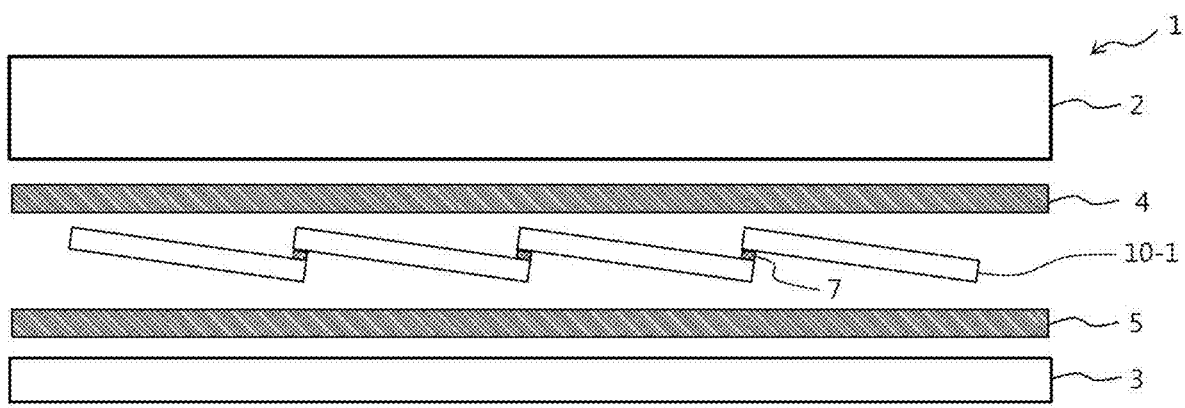
FIG. 12 is a cross-sectional view illustrating a photovoltaic module according to an embodiment of the present invention.

As illustrated in FIG. 12, in a photovoltaic module 1 according to an embodiment of the present invention, a plurality of divided single cells 10-1 are connected using an ECA 7 to form a string having a shingled array structure.

In addition, an ECA 7 is an ECA used in wiring circuits or electrical and electronic products, and an epoxy resin mixed with silver particles is used as the ECA. A principle by which the electrically conductive adhesive has an electrically conductive property is that conductive fillers dispersed in an adhesive come in contact with each other to have the electrically conductive property in a curing or solidifying process. In addition, the ECA is applied using a micro dispenser, an amount of the ECA discharged from a needle should be constant, and the ECA should not flow down. A metal powder of gold, platinum, silver, copper, nickel, or the like, carbon fiber, graphite, a composite powder, or the like may be used as the conductive filler.

A first encapsulation material 4 and a front surface cover 2 are stacked on the string, a second encapsulation material 5 and a rear surface back sheet 3 are stacked under the string, and a lamination process for integrating all sequentially stacked module components (the front surface cover, the first encapsulation material, the string, the second encapsulation material, and the rear surface back sheet) is performed using a lamination apparatus. The lamination process may be performed at a low temperature of 140 to 160° C.

The front surface cover 2 serves to protect a solar cell from an external impact and the like. A transparent material such as ethylene tetrafluoroethylene (ETFE), ethylene chlorotrifluoroethylene (ECTFE), polycarbonate (PC), acrylic, or the like may be used as a material of the front surface cover 2. The front surface cover 2 may have waterproof, insulation, and ultraviolet protection functions and may be manufactured in one of various shapes such as a quadrangular or circular shape according to an installation environment or design.

A tedlar polyester tedlar (TPT) of a fluororesin series or polyethylene terephthalate (PET) type transparent synthetic resin may be used as the rear surface back sheet 3, and the rear surface back sheet 3 serves waterproof, insulation, and ultraviolet protection functions, and the like.

A protection film may be formed at one side of each of the front surface cover 2 and the rear surface back sheet 3. An ultraviolet protection film may be used as the protection film, and the protection film may block ultraviolet light and the like transferred to the solar cell through glass to help increase a lifetime of the solar cell.

The first and second encapsulation materials 4 and 5 are materials for increasing a lifetime of the photovoltaic module, are positioned on front and rear surfaces of the divided cell 10-1 to serve as buffers for preventing damage to the cell, and are adhered to the front surface cover 2 and the rear surface back sheet 3 for encapsulation. An ethylene-vinyl acetate copolymer (EVA), polyolefin (POE), ionomer, or the like may be used for each of the encapsulation materials.

Figure 13:
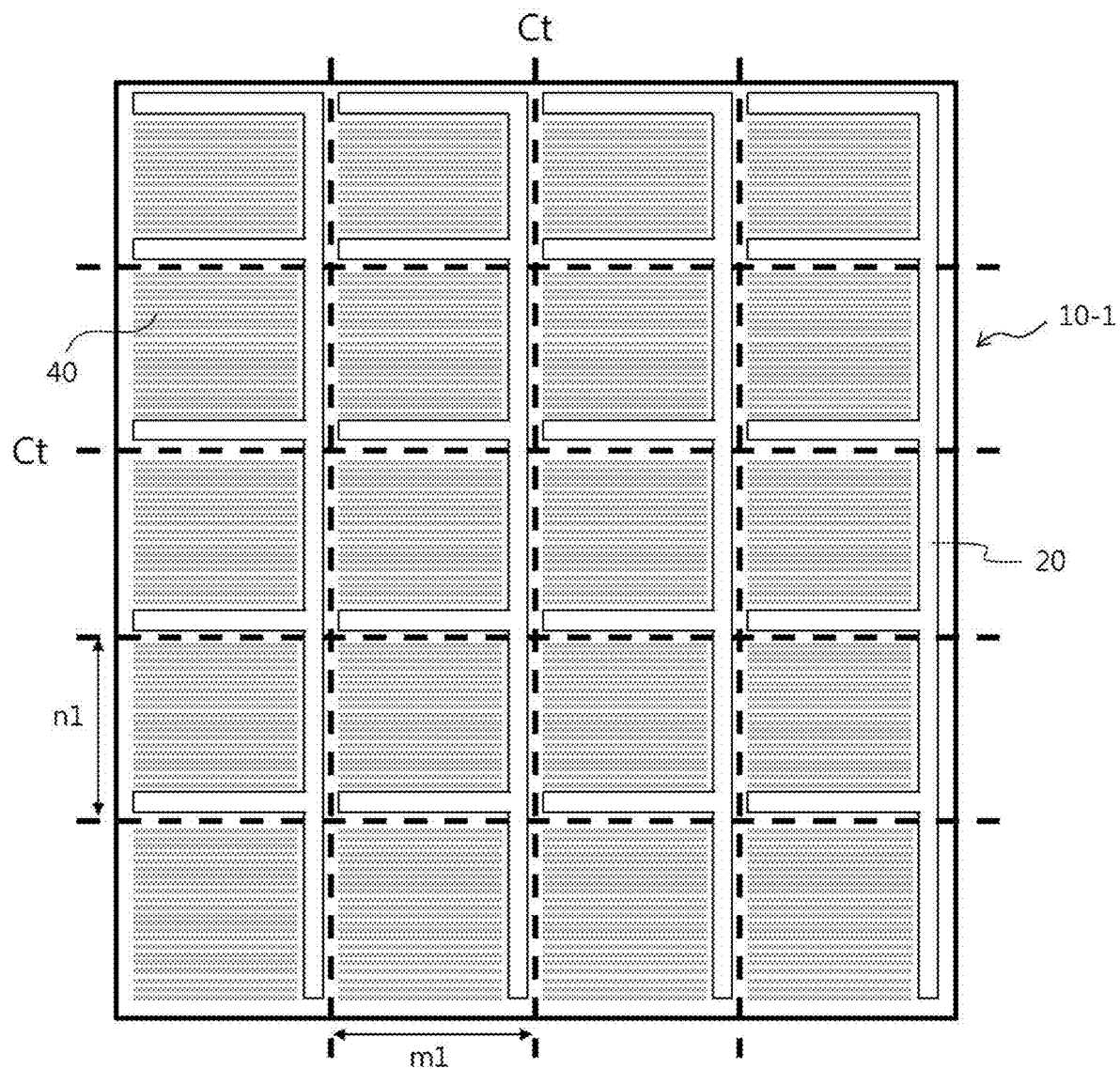
FIG. 13 is a view illustrating a front surface of a solar cell according to an embodiment of the present invention.

As illustrated in FIG. 13, a solar cell is divided into a plurality of pieces in order to variously design a shape of a photovoltaic module. The solar cell may be cut and divided along cut lines Ct in a checkerboard shape through a laser scribing process into unit cells 10-1 having one of various shapes. For example, in each of the divided unit cells 10-1, a horizontal width m1 is in the range of 3 to 50 mm, and a vertical width n1 is in the range of 25 to 170 mm. Front surface electrodes 20 and finger electrodes 40 may be formed on a front surface of the solar cell as electrode members, and the divided unit cells 10-1 may have substantially the same size and the same shape, and the same electrode pattern may be formed on the divided unit cells 10-1.

The solar cell is formed on a semiconductor substrate. The semiconductor substrate may be a semiconductor including a first conductive type, for example, a conductive n-type or p-type, silicon, and each of emitters includes second conductive type, for example, conductive p-type or n-type, impurities of which the conductive type is opposite to that of the semiconductor substrate and forms a p-n junction with the semiconductor substrate.

The plurality of finger electrodes 40 are connected to the front surface electrodes 20 to collect photoelectrically converted carriers, and a line width of each of the finger electrodes 40 is in the range of 0.08 to 0.12 mm.

The front surface electrodes 20 serve as busbar electrodes which move the carriers collected through the finger electrodes 40 to an external storage battery or the like. A line width of each of the front surface electrodes 20 is in the range of 0.8 to 1.2 mm. Each of the front surface electrode 20 and the finger electrode 40 includes at least one selected from the group consisting of Ni, Cu, Ag, Al, Sn, Zn, In, Ti, Au, and a combination thereof. In the embodiment, each of the front surface electrode 20 and the finger electrode 40 includes Ag.

Figure 14:
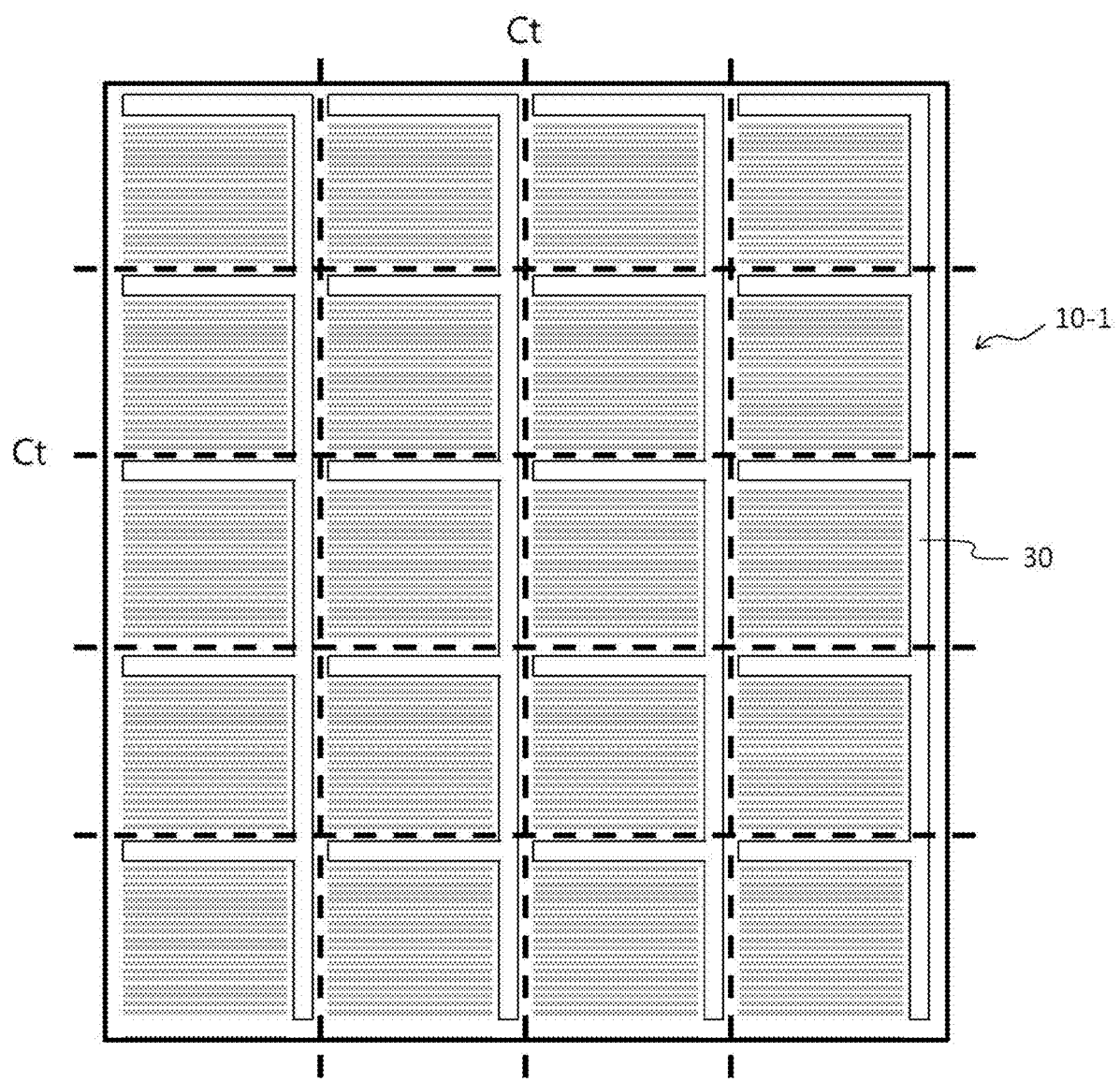
FIG. 14 is a view illustrating a rear surface of the solar cell of FIG. 13.

Referring to FIG. 14, rear surface electrodes 30 corresponding to the number of divided cells may be formed on rear surfaces of the divided unit cells 10-1. Each of the rear surface electrodes 30 may be formed to have the same electrode pattern as that formed on front surfaces. The rear surface electrode 30 is electrically and physically connected to the front surface electrode 20 of another unit cell 10-1. A material of the rear surface electrode 30 includes at least one selected from the group consisting of Ni, Cu, Ag, Al, Sn, Zn, In, Ti, Au, and a combination thereof. In the embodiment, the rear surface electrode 30 includes Al in consideration of manufacturing costs and the like.

Figure 15:
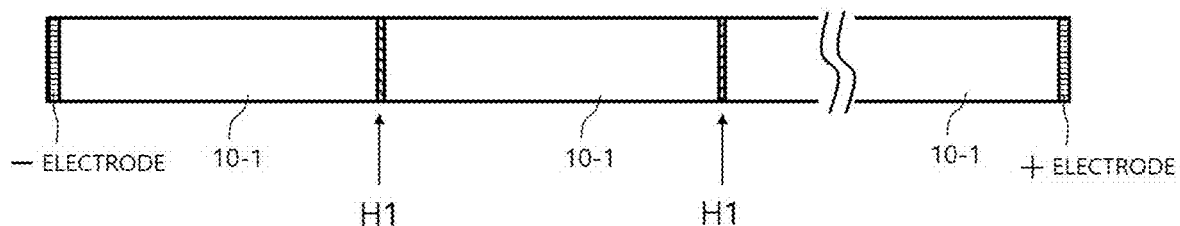
FIG. 15 is a view illustrating a string of a shingled array structure according to an embodiment of the present invention.

As illustrated in FIG. 15, a string having a shingled array structure is formed by connecting a plurality of unit cells 10-1, and a positive (−) electrode and a negative (+) electrode formed at two sides of the string are electrically connected to an external storage battery. In this case, a short side of any one unit cell 10-1 and a short side of another unit cell 10-1 partially overlap, and as a length of the string increases, the number of overlapping portions H1 of the unit cells 10-1 increases.

Figure 16:
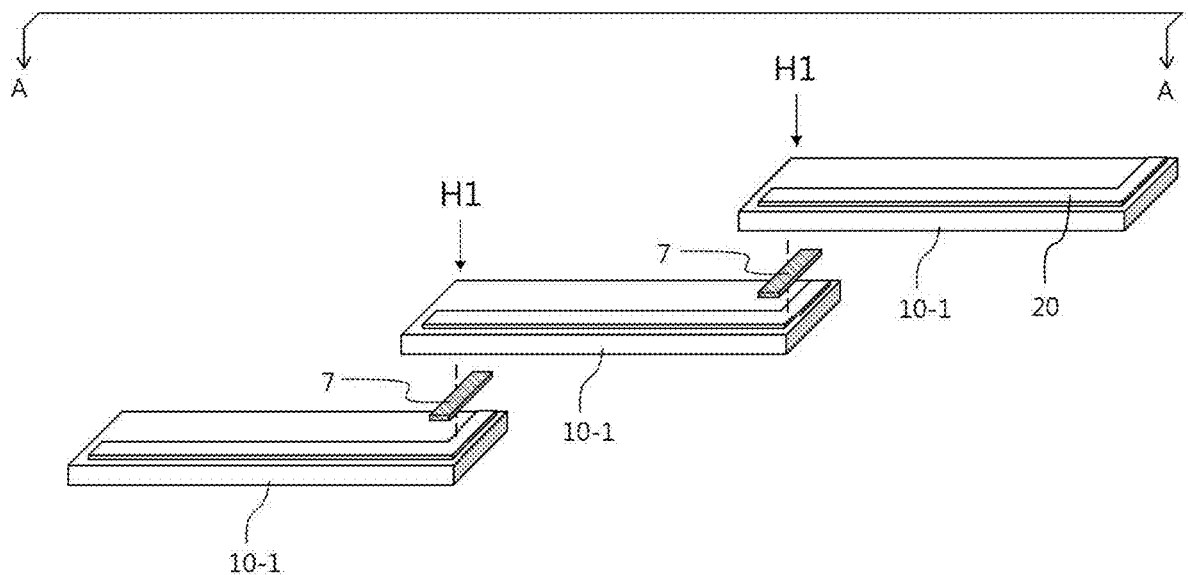
FIG. 16 is a view for describing a process of connecting divided unit cells for manufacturing the string of FIG. 15.
Figure 17:
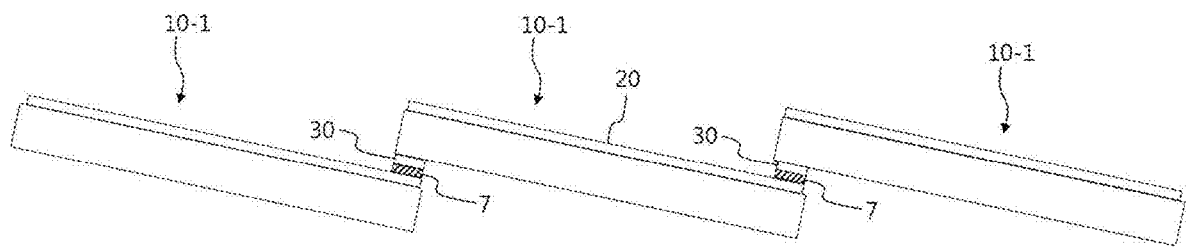
FIG. 17 is a cross-sectional view along line A-A of FIG. 16.

As illustrated in FIGS. 16 and 17, the divided unit cells 10-1 may be connected by an ECA 7 through a thermal process in order to form the string having the shingled array structure. For example, the string may be formed by overlapping a short side of any one unit cell 10-1 and a short side of another unit cell 10-1, and by arranging the ECA 7 between front surface electrodes 20 of the lower unit cell 10-1 and rear surface electrodes 30 of the upper unit cell 10-1 at the portions H1 which face and overlap each other and bonding the front surface electrodes 20 and the rear surface electrodes 30 through a thermal process, two unit cells 10-1 are integrated, and an electrical connection state in which a current collected through finger electrodes 40 flows is formed at the same time.

Figure 18:
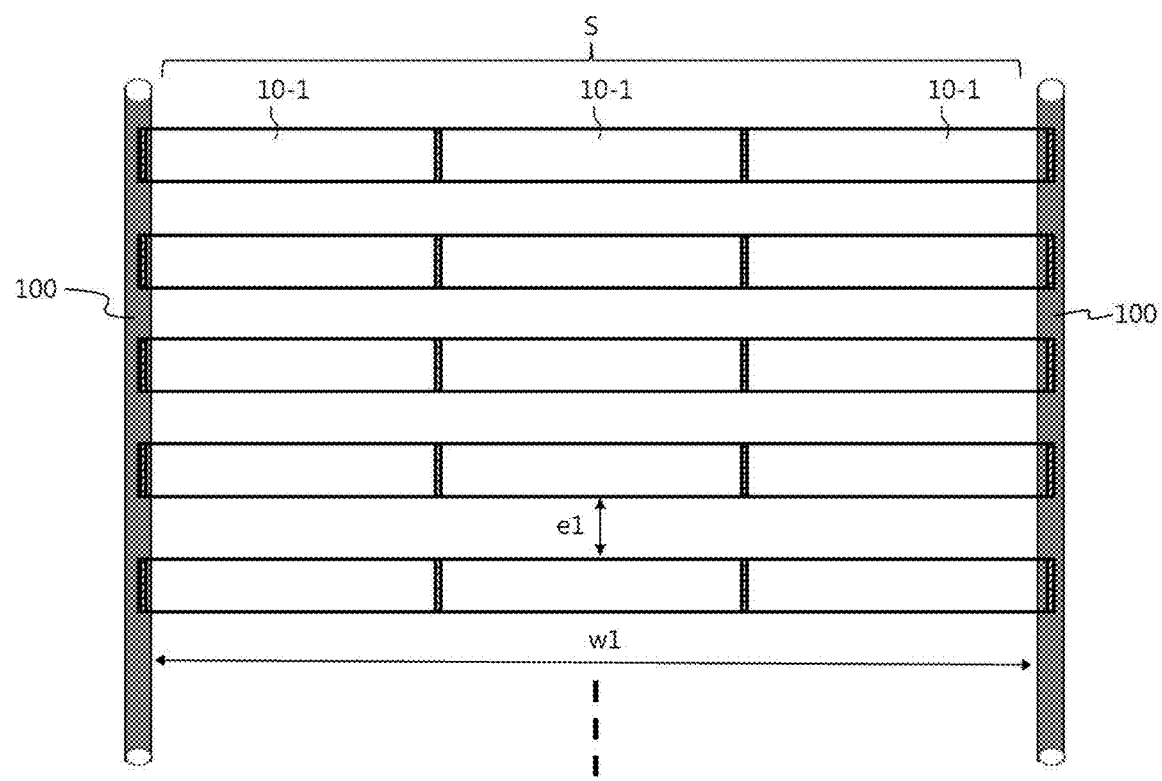
FIG. 18 is a view illustrating strings connected in parallel using a flexible connecting wire according to an embodiment of the present invention.

A photovoltaic module according to an embodiment may be applied as a photovoltaic module for a window, which secures a light receiving property and has superior stability using a translucent high-efficiency silicon solar cells, and a double-sided light receiving photovoltaic module, which is rollable and is applied to a window of a building or vehicle, is proposed as illustrated in FIG. 18.

In FIG. 18, a window type photovoltaic module may be formed by connecting a plurality of strings S in parallel according to various sizes and shapes. Each of the strings S includes unit cells 10-1 which are connected as a shingled array structure. A length w1 of the string S is in the range of 50 to 3,000 mm, and a width of the string S is in the range of 3 to 25 mm. In this case, an output voltage of the string S corresponds to the number of unit cells 10-1 connected in series.

Output voltage Vs of string S=0.6 V×the number of unit cells connected in series.

The plurality of strings S may be disposed in consideration of an installation environment of the window type photovoltaic module. A separation distance e1 between the strings S is in the range of 1 to 100 mm. In addition, two sides of the strings S serve as negative (−) electrodes and positive (+) electrodes, and the electrodes are electrically connected to using connecting wires 100 in which conductive wires 110 are embedded. Each of the connecting wires 100 may be formed of a flexible material having an annular shape. The number of strings S connected in series or parallel by the flexible connecting wires 100 is in the range of 2 to 200.

Figure 19:
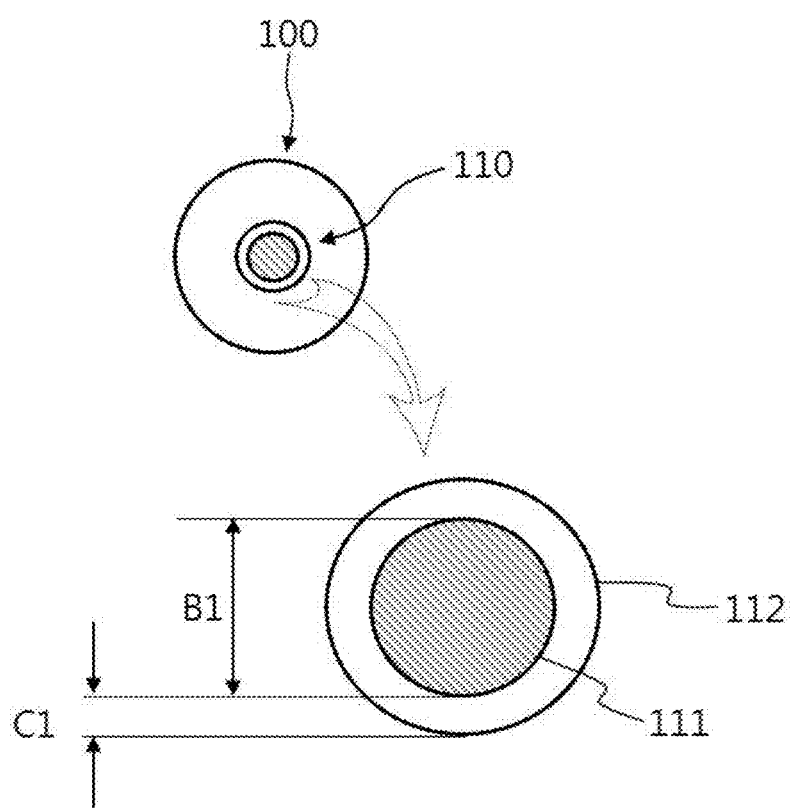
FIG. 19 is a view illustrating a conductive wire structure of FIG. 18.

Referring to FIG. 19, a conductor that has a superior electrical conductivity and of which a cross section has a circular shape may be used in the conductive wire 110, and the conductive wire 110 may be formed as a composite including a core 111 and a passivation layer 120.

Any one of Cu and Al may be selectively used as the core 111. The passivation layer 112 is formed on a surface of the core 111, and any one among Sn, highly pure In, and Ag may be selectively used as the passivation layer 112. When Cu is used as the core 111 in the embodiment, Sn is plated as the passivation layer 112 to manufacture the conductive wire 110. A diameter B1 of the core 111 and a thickness C1 of the passivation layer 112 may be changed according to a bonding area of the electrodes of the string and electrical properties. Unlike the embodiment, a conductive wire 110 may be formed of a single metal material as a conductor.

Figure 20:
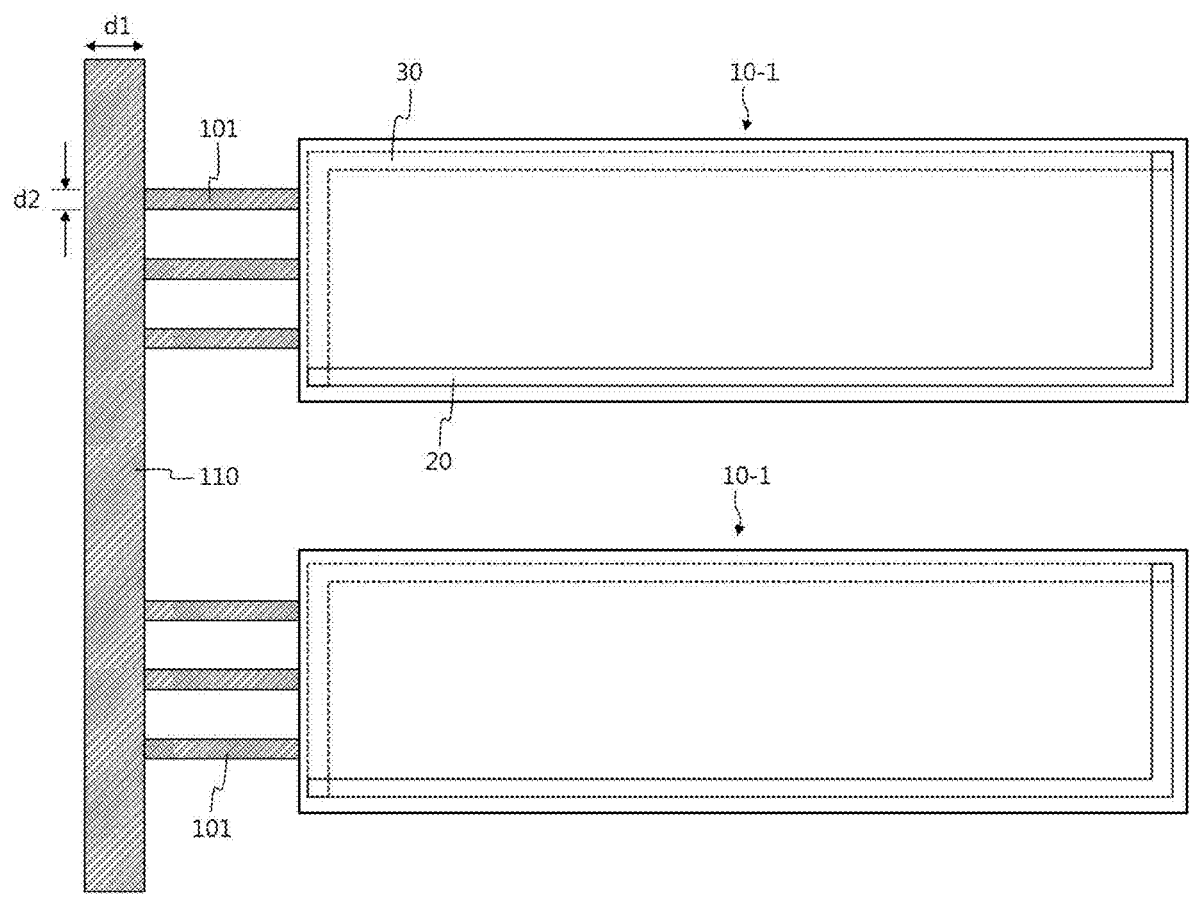
FIG. 20 is a view illustrating strings connected in parallel using a conductive wire having an "E" type electrical connection pattern according to an embodiment of the present invention.

There are two forms in which the flexible connection wirings 100 are connected to the electrodes on two sides of the strings S, and the forms are classified according to a shape of an electrical connection pattern which connects the conductive wire 110 and an electrode of a single cell 10-1. For example, as illustrated in FIG. 20, when the conductive wire 110 having an "E" type electrical connection pattern is used, first auxiliary conductive wires 101 branched off from the conductive wire 110 may be directly connected to a rear surface electrode 30 of the single cell 10-1. In this case, each of three thin first auxiliary conductive wires 101 branched off from the thick conductive wire 110 may be connected to the rear surface electrode 30 of the single cell 10-1. A diameter d2 of the divided first auxiliary conductive wire 101 is the same as a width of the rear surface electrode 30, and a diameter d1 of the conductive wire 110 may be formed to be 2 to 4 times the width of the rear surface electrode 30.

Figure 21:
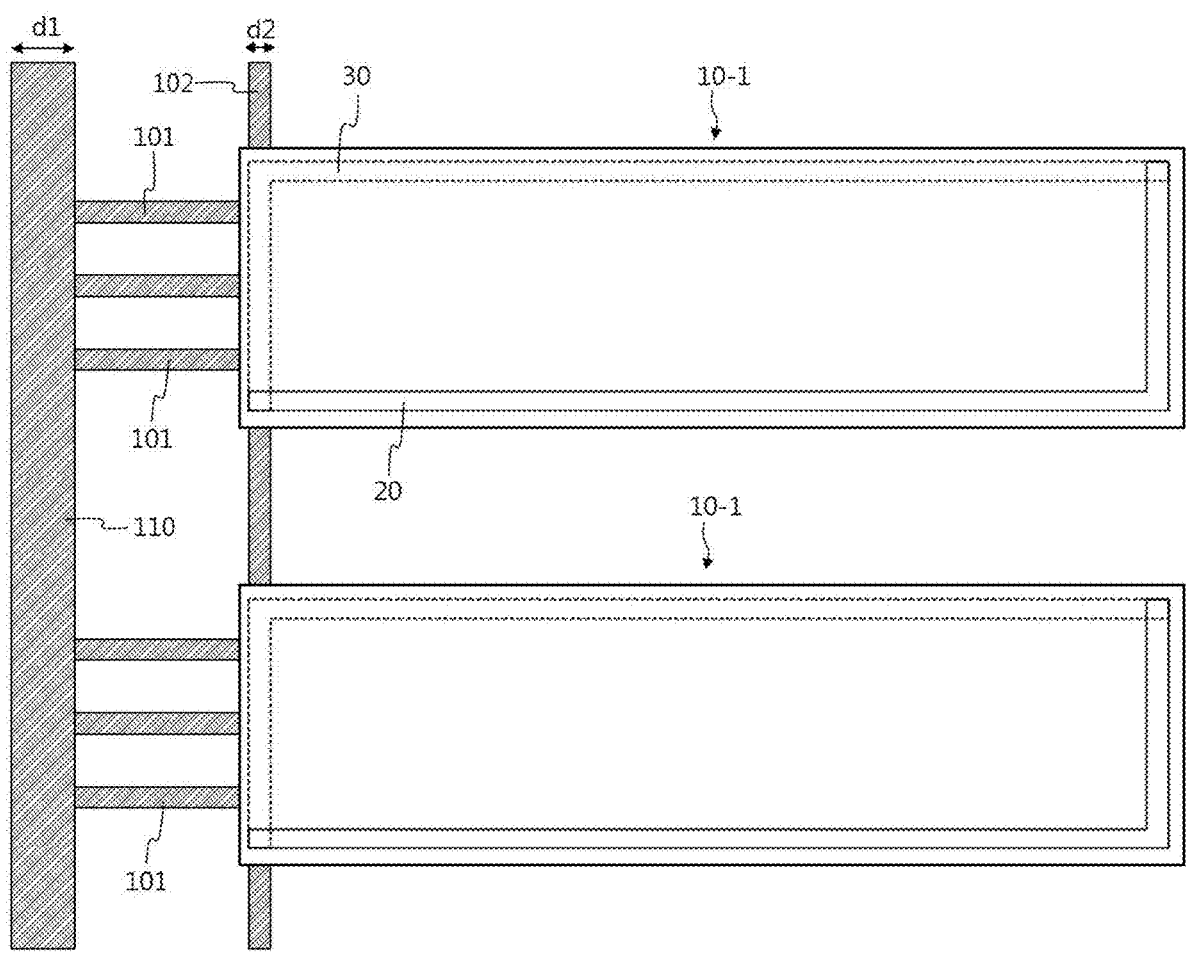
FIG. 21 is a view illustrating strings connected in parallel using a conductive wire having an "H" type electrical connection pattern according to another embodiment of the present invention.

As another example, as illustrated in FIG. 21, when a conductive wire 110 having an "H" type electrical connection pattern is used, a second auxiliary conductive wire 102 may be connected to rear surface electrodes 30 of single cells 10-1 through first auxiliary conductive wires 101. A conductive wire 110 and the second auxiliary conductive wire 102 are arranged in parallel, and the first auxiliary conductive wires 101 are disposed between and connected to the conductive wire 110 and the second auxiliary conductive wire 102. In this case, a diameter d2 of the first auxiliary conductive wire 101 and a diameter d3 of the second auxiliary conductive wire 102 may be the same as a width of the rear surface electrode 30, and a diameter d1 of the conductive wire 110 may be formed to be 2 to 4 times the width of the rear surface electrode 30.

Figure 22A:
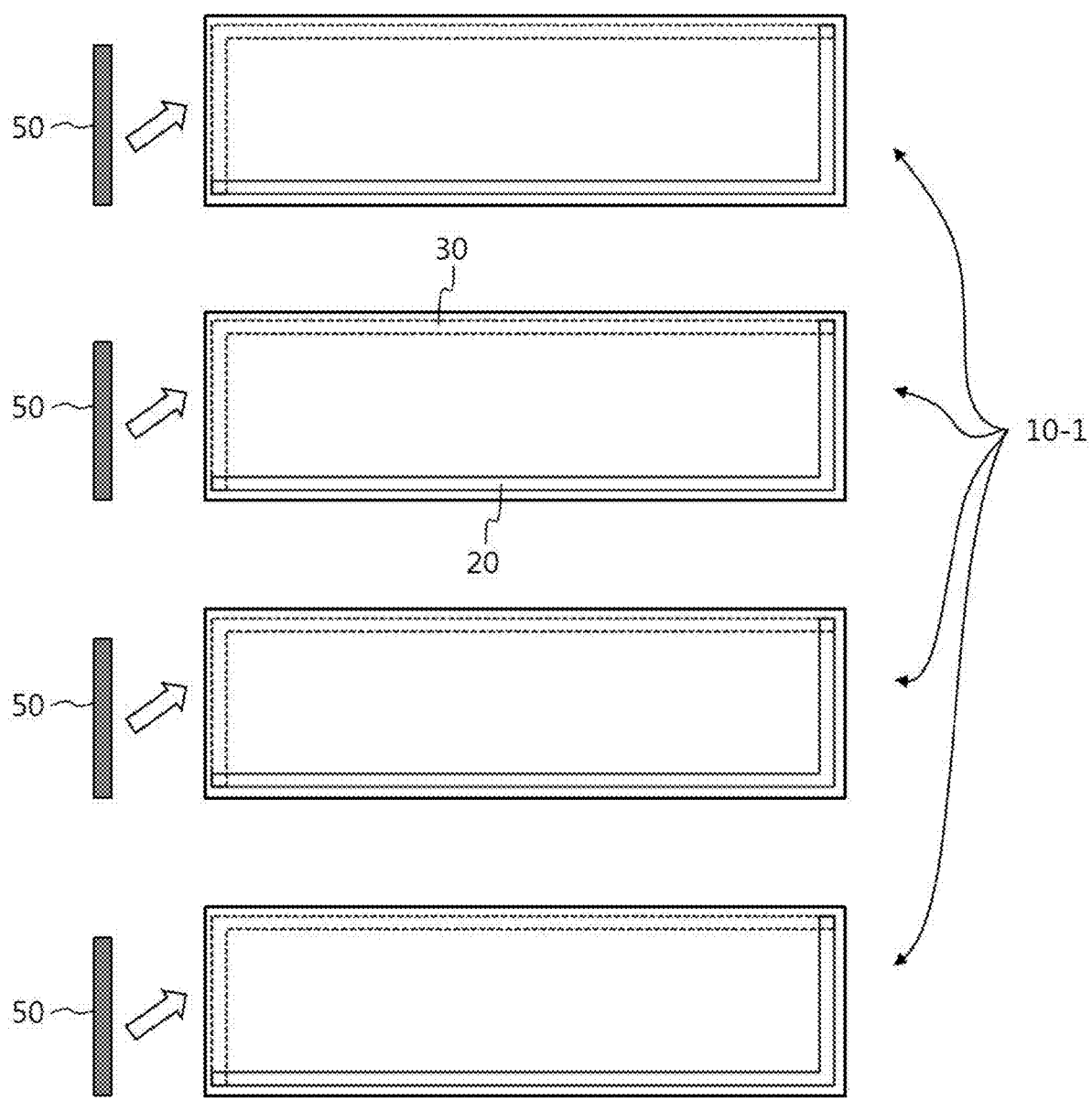
FIGS. 22A to 22C are views showing a series of process of connecting strings in parallel using the conductive wire having the "H" type electrical connection pattern of FIG. 21.

A manufacturing process of connecting single cells of a string using a conductive wire having an "H" type electrical connection pattern will be described. First, as illustrated in FIG. 22A, single cells 10-1 forming a string are prepared, and an ECA 50 is applied on rear surface electrodes 30 of the single cells 10-1.

Figure 22B:
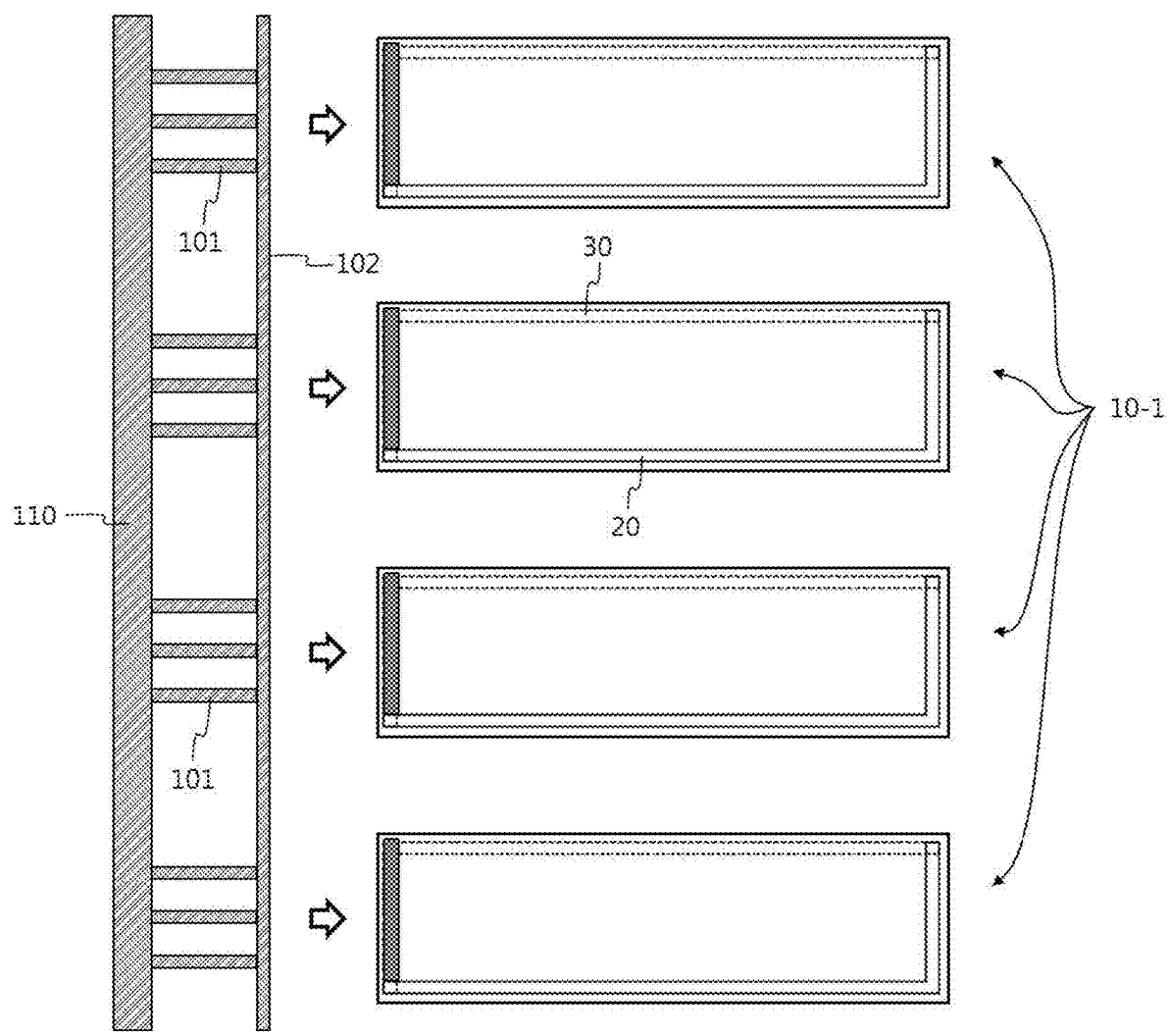
Figure 22C:
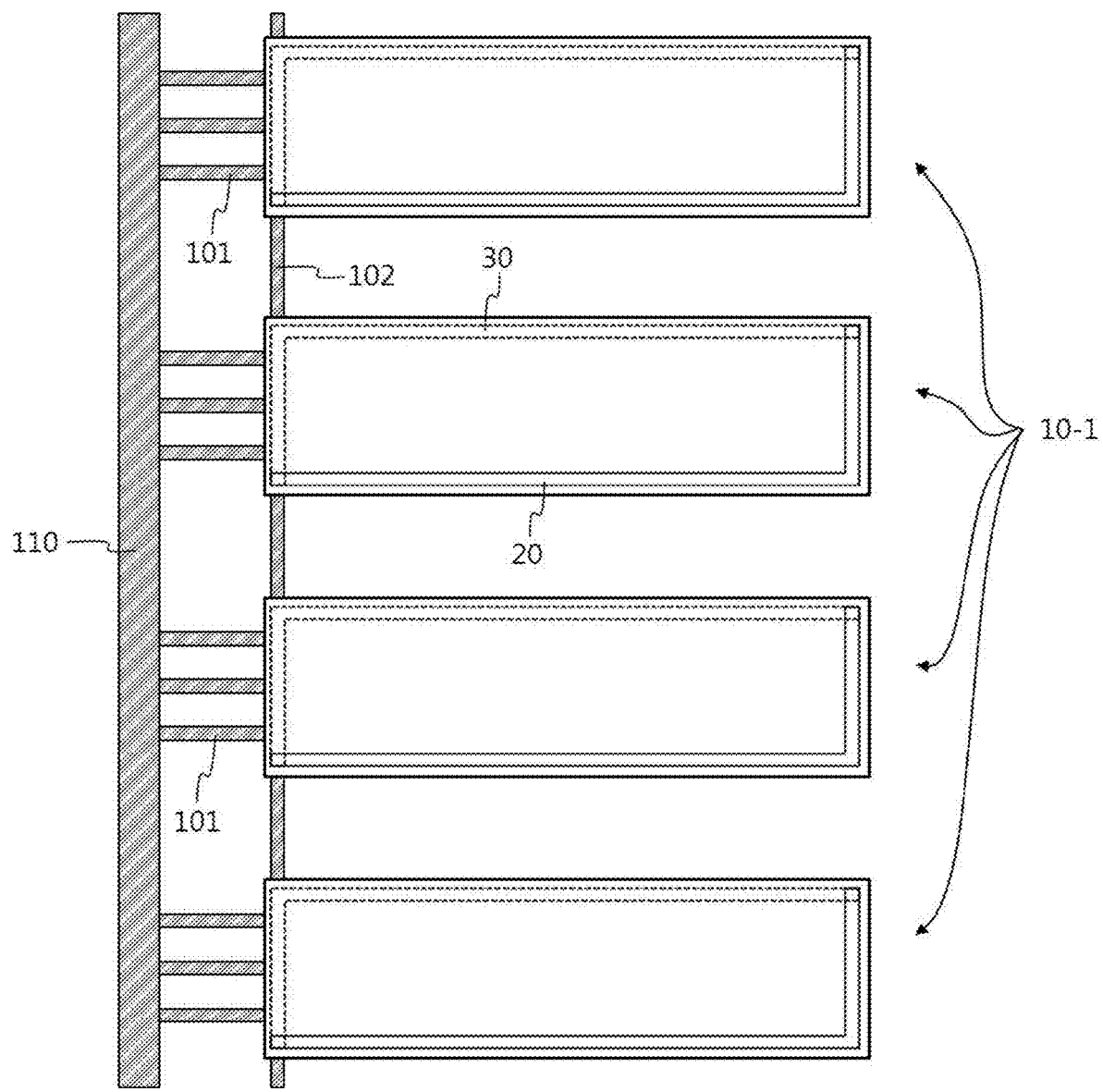

Then, as illustrated in FIG. 22B, in a state in which a pre-manufactured second auxiliary conductive wire 102 of a conductive wire 110 having an "H" type electrical connection pattern is disposed on the ECA 50, the ECA 50 is cured through a thermal process. The curing process may be performed at a temperature of 130 to 150° C. for a predetermined time (10 seconds or less). When the curing process is completed, as illustrated in FIG. 22C, the second auxiliary conductive wire 102 arranged parallel to the conductive wire 110 may electrically connect the single cells 10-1 forming a plurality of strings in parallel.

Figure 23:
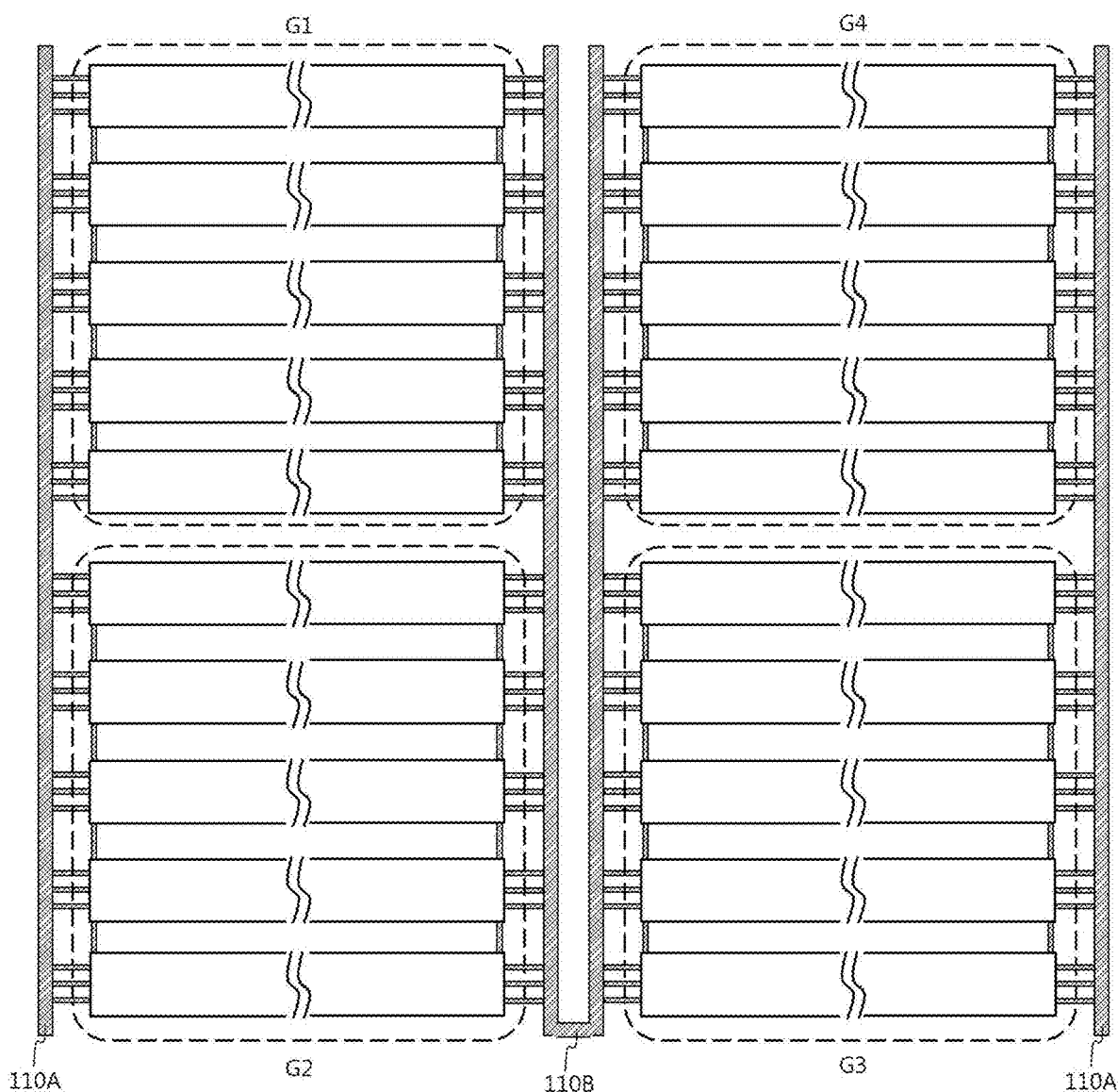
FIG. 23 is a view illustrating a window type flexible photovoltaic module including string bundles according to an embodiment of the present invention.

As illustrated in FIG. 23, in a window type flexible photovoltaic module according to an embodiment, a plurality of string bundles G1, G2, G3, and G4 may be connected using flexible conductive wires 110A and 110B.

In order to reduce shading loss, each of the string bundles G1, G2, G3, and G4 is formed by connecting a plurality of strings in parallel. In each of the string bundles G1, G2, G3, and G4, the number of the strings is set to correspond to an installation area to optimize an output current of the photovoltaic module, and 5 to 10 strings may be connected.

The string bundles G1, G2, G3, and G4 are connected in series to implement the extended window type flexible photovoltaic module and may be connected using conductive wires having an "E" or "H" type electrical connection pattern described with reference to FIGS. 20 and 21 so that damage to the strings and unit cells may be minimized.

Output power of the window type flexible photovoltaic module illustrated in FIG. 23 may be changed according to an aperture ratio of a 1 m² window. The table below shows an expected output value according to the aperture ratio.

TABLE 1

| Photovoltaic module specification | Aperture ratio | Output power |
|---|---|---|
| 1 m² window | 50% | 106.9 W |
| Transmittance of suntan window: 20 to 30% | 40% | 128.2 W |
| Total power when unit cell of 5.2 W/sheet is applied: 213.6 W | 30% | 149.5 W |

Figure 24:
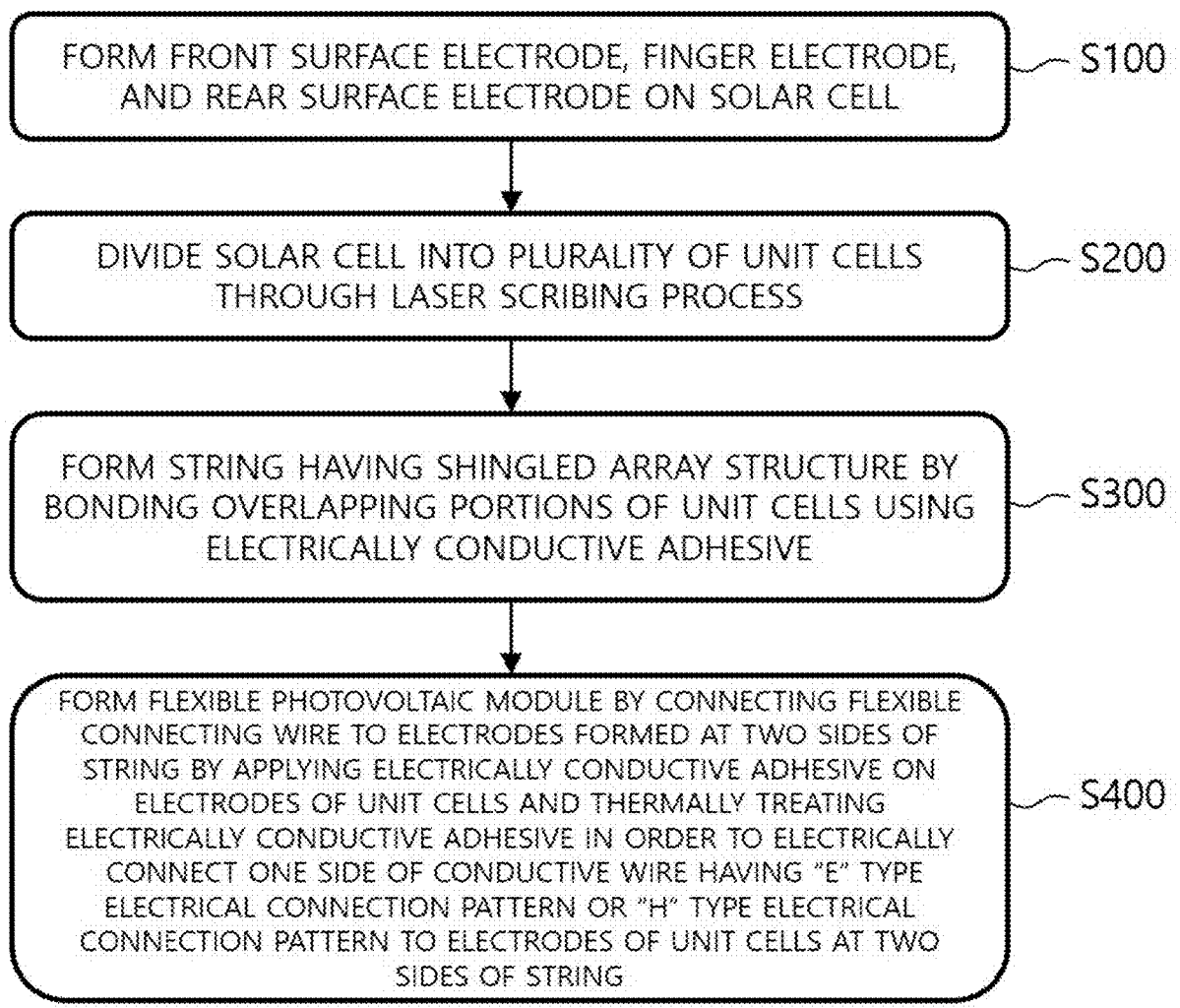
FIG. 24 is a flowchart for describing a manufacturing process of a photovoltaic module according to an embodiment of the present invention.

A method of manufacturing a photovoltaic module according to an embodiment will be described with reference to FIG. 24. First, a solar cell in which finger electrodes 40 and front surface electrodes 20 are formed on a front surface and rear surface electrodes 30 are formed on a rear surface is provided (S100). Then, the solar cell provided in operation S100 is cut in a rectangular shape to divide the solar cell in a plurality of unit cells 10-1 (S200). The cutting in operation S200 may be performed by a nanosecond laser (532 nm, 20 ns, 30 to 100 KHz from coherent). That is, the cutting in operation S20 may be performed by the 20 ns laser which uses a wavelength of 532 nm and in which an average power is set to 10 W, a frequency is set to 50 KHz, and a scan speed is set to 1,300 mm/s.

The unit cells 10-1 provided in operation S200 are disposed to partially overlap, and an ECA 7 is applied to any one side to connect the unit cells 10-1 as a shingled array structure to form strings (S300). In this case, the application of the ECA may be performed on any one side among the rear surface electrode 30 of any one upper unit cell 10-1 and the front surface electrode 20 of another lower unit cell 10-1 or on both sides. An application position of the ECA may be determined according to properties and a discharge amount of the ECA. When the ECA is applied, the unit cells 10-1 are connected as the shingled array structure to form the strings through a thermal process (for 25 to 35 seconds at a temperature of 130 to 150° C.).

Then, the plurality of strings S are connected using a connecting wire 100 to form a window type flexible photovoltaic module (S400). One side of a conductive wire 110 is electrically connected to negative (−) electrodes and positive (+) electrodes formed at two sides of each of the strings S.

For example, as illustrated in FIG. 20, when the conductive wire 110 having an "E" type electrical connection pattern is used, first auxiliary conductive wires 101 branched off from the conductive wire 110 may be directly connected to the rear surface electrodes 30 of the single cells 10-1. In this case, three thin first auxiliary conductive wires 101 branched off from the thick conductive wire 110 may be connected to the rear surface electrodes 30 of the single cells 10-1. A diameter d2 of each of the branched first auxiliary conductive wires 101 may be the same as a width of each of the rear surface electrodes 30, and a diameter d1 of the conductive wire 110 may be formed to be 2 to 4 times the width of the rear surface electrode 30.

As another example, as illustrated in FIG. 21, when the conductive wire 110 having an "H" type electrical connection pattern is used, a second auxiliary conductive wire 102 may be directly connected to the rear surface electrodes 30 of the single cells 10-1 through first auxiliary conductive wires 101. The conductive wire 110 and the second auxiliary conductive wire 102 are arranged in parallel, and the first auxiliary conductive wires 101 are disposed between and connected to the conductive wire 110 and the second auxiliary conductive wire 102. In this case, a diameter d2 of each of the first auxiliary conductive wires 101 and a diameter d3 of the second auxiliary conductive wire 102 may be the same as a width of the rear surface electrode 30, and the diameter d1 of the conductive wire 110 may be formed to be 2 to 4 times the width of the rear surface electrode 30.

The above description of the present invention is only exemplary, and it will be understood by those skilled in the art that the present invention may be easily performed in other concrete forms without changing the technological scope and essential features.

INDUSTRIAL APPLICABILITY

The present invention can be applied to the field of manufacturing a photovoltaic module.

The invention claimed is:

1. A shingled photovoltaic module comprising a plurality of finger electrodes and a busbar electrode on a front surface of a first divided unit cell,
   wherein the plurality of finger electrodes each extend in a first direction parallel to a short side of the first divided unit cell,
   wherein the busbar electrode of the first divided unit cell includes a collection electrode line and a connecting electrode line, the collection electrode line extends in a second direction parallel to a long side of the first divided unit cell and connects ends of the plurality of finger electrodes, and the connecting electrode line is branched off from an end of the collection electrode line and extends in the first direction capable of being electrically connected to a second divided unit cell,
   wherein the connecting electrode line is perpendicularly bent from the end of the collection electrode line so that the busbar electrode is formed in a "T" shape,
   wherein a rear surface electrode is formed on a rear surface of the first divided unit cell in a "T" shape capable of being electrically connected to a connecting electrode line of the second divided unit cell,
   wherein the short side of the first divided unit cell is connected to a short side of the second divided unit cell, and
   wherein the "T" shape of the busbar electrode is the same as that of the rear surface electrode.

2. The shingled photovoltaic module of claim 1, wherein:
   a line width of the busbar electrode is in the range of 0.8 to 1.2 mm; and
   a line width of each of the plurality of finger electrodes is in the range of 0.08 to 0.12 mm.

3. The shingled photovoltaic module of claim 1, wherein the short side of the first divided unit cell is in the range of 13.3 to 66.6 mm.

4. The shingled photovoltaic module of claim 1, wherein the plurality of finger electrodes of the first divided unit cell include a first finger electrode and a second finger electrode that are adjacent to each other in the first direction, the first finger electrode has a first length in the first direction, the second finger electrode has a second length in the first direction, and the connecting electrode line of the first divided unit cell has a third length in the first direction, the third length being greater than a sum of the first length and the second length.

5. The shingled photovoltaic module of claim 4, wherein the connecting electrode line is disposed adjacent to a first side surface of the first divided unit cell, and the rear surface electrode includes a first portion extending in the second direction and a second portion branched off from an end of the first portion and disposed adjacent to a second side surface of the first divided unit cell, the second side surface being opposite the first side surface.

* * * * *